US009685859B2

(12) United States Patent
Akahane

(10) Patent No.: US 9,685,859 B2
(45) Date of Patent: Jun. 20, 2017

(54) SIGNAL TRANSMISSION CIRCUIT

(71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 230 days.

(21) Appl. No.: 14/789,565

(22) Filed: Jul. 1, 2015

(65) Prior Publication Data
US 2015/0303797 A1 Oct. 22, 2015

Related U.S. Application Data

(63) Continuation of application No. PCT/JP2014/066894, filed on Jun. 25, 2014.

(30) Foreign Application Priority Data

Jun. 25, 2013 (JP) ................... 2013-133228

(51) Int. Cl.
*H03K 3/00* (2006.01)
*H02M 3/156* (2006.01)
(Continued)

(52) U.S. Cl.
CPC ............ *H02M 3/156* (2013.01); *H02M 1/32* (2013.01); *H02M 3/158* (2013.01); *H03K 17/18* (2013.01);
(Continued)

(58) Field of Classification Search
USPC ....................................................... 327/108
See application file for complete search history.

(56) References Cited

U.S. PATENT DOCUMENTS 3,798,596 A 3/1974 Sumiyoshi et al.
5,079,688 A 1/1992 Kido
(Continued)

FOREIGN PATENT DOCUMENTS

JP 08-330929 12/1996
JP 09-200017 7/1997
(Continued)

OTHER PUBLICATIONS

U.S. Appl. No. 14/789,199, filed Jul. 1, 2015, Akahane, Fuji Electric Co., Ltd.
(Continued)

*Primary Examiner* — Lincoln Donovan
*Assistant Examiner* — Patrick Chen

(57) ABSTRACT

A signal transmission circuit with a first circuit in a signal transmission side having first and second semiconductor switch elements transmitting a reference potential or power supply voltage of the first circuit to a second circuit by being alternatively driven on and off according to a multiple of signals. The second circuit in a signal reception side having a voltage conversion circuit, including an in-phase noise filter that eliminates in-phase noise superimposed on the voltage transmitted via the first and second semiconductor switch elements, generating first and second pulse signals in accordance with the transmitted voltage, a latch circuit latching each of the first and second pulse signals with the first and second pulse signals as a clock, and a signal analysis circuit analyzing the first and second pulse signals latched by the latch circuit, and generating an output signal according to the category of the multiple of signals.

11 Claims, 25 Drawing Sheets

(51) Int. Cl.
*H02M 1/32* (2007.01)
*H02M 3/158* (2006.01)
*H03K 17/18* (2006.01)
*H03K 19/0185* (2006.01)
*H02M 1/08* (2006.01)

(52) U.S. Cl.
CPC ....... *H03K 19/018521* (2013.01); *H02M 1/08* (2013.01); *H03K 2217/0063* (2013.01); *H03K 2217/0072* (2013.01)

(56) References Cited

U.S. PATENT DOCUMENTS

| | | | |
|---|---|---|---|
| 5,543,994 | A | 8/1996 | Wilhelm et al. |
| 5,917,359 | A | 6/1999 | Fukunaga et al. |
| 6,181,587 | B1 | 1/2001 | Kuramoto et al. |
| 6,208,280 | B1 | 3/2001 | Baker et al. |
| 6,529,061 | B1 * | 3/2003 | Orita ................ H03K 17/162 327/112 |
| 2002/0039269 | A1 * | 4/2002 | Kumagai ................ H02M 1/32 361/93.1 |
| 2003/0012040 | A1 | 1/2003 | Orita et al. |
| 2003/0030394 | A1 | 2/2003 | Majumdar et al. |
| 2011/0043269 | A1 * | 2/2011 | Nishijima ........ H03K 19/018521 327/333 |
| 2011/0134710 | A1 * | 6/2011 | Akahane ........ H03K 19/018521 365/189.11 |
| 2012/0081149 | A1 * | 4/2012 | Akahane ........ H03K 19/018521 326/81 |

FOREIGN PATENT DOCUMENTS

| | | |
|---|---|---|
| JP | 11-017508 | 1/1999 |
| JP | 2886495 | 2/1999 |
| JP | 2002-027665 | 1/2002 |
| JP | 2003-032102 | 1/2003 |
| JP | 2005-184656 | 7/2005 |
| JP | 2007-082360 | 3/2007 |
| JP | 2011-044770 | 3/2011 |
| WO | WO 2008/101548 A1 | 8/2008 |

OTHER PUBLICATIONS

U.S. Office Action dated Aug. 26, 2016 in U.S. Appl. No. 14/789,199.
International Search Report mailed Sep. 16, 2014 in corresponding international application PCT/JP2014/066894.
Extended European Search Report dated Aug. 17, 2016 in corresponding European Patent Application No. 14817721.5.
Extended European Search Report dated Jun. 30, 2016 in corresponding European Patent Application No. 14818518.4.

* cited by examiner

FIG.3

| INPUT | | | OUTPUT | | | ABNORMALITY CATEGORY |
|---|---|---|---|---|---|---|
| OHIN | UVIN | OCIN | OHE | UVE | OCE | |
| 0 | 0 | 0 | 0 | 0 | 0 | NONE |
| 1 | X | X | 1 | 0 | 0 | OVERHEAT |
| 0 | 1 | X | 0 | 1 | 0 | LOW VOLTAGE |
| 0 | 0 | 1 | 0 | 0 | 1 | OVERCURRENT |

"X" INDICATES "Don't care"

2 SYSTEMS × 2 STAGES = 4 KINDS

ERD1[2:1]  [2] [1]
           | 0 | 0 |   | 0 | 1 |   | 1 | 0 |   | 1 | 1 |
ERD2[2:1]  | 1 | 1 |   | 1 | 0 |   | 0 | 1 |   | 0 | 0 |

4 BITS OF 2 SYSTEMS × 2 STAGES REPRESENT 1 SYMBOL (b)

2 SYSTEMS × 3 STAGES = 8 KINDS

ERD1[3:1]  [3] [2] [1]
           |0|0|0|  |0|0|1|  |0|1|0|  |0|1|1|  |1|0|0|  |1|0|1|  |1|1|0|  |1|1|1|
ERD2[3:1]  |1|1|1|  |1|1|0|  |1|0|1|  |1|0|0|  |0|1|1|  |0|1|0|  |0|0|1|  |0|0|0|

6 BITS OF 2 SYSTEMS × 3 STAGES REPRESENT 1 SYMBOL

FIG.9

| STATUS | PM1 DRN | PM2 DRN | NOT1 OUTPUT | NOT2 OUTPUT | AND OUTPUT | ER1 | ER2 |
|---|---|---|---|---|---|---|---|
| NORMALLY OFF | 0 | 0 | 1 | 1 | 0 | 0 | 0 |
| SYSTEM 1 ON | 1 | 0 | 0 | 1 | 0 | 1 | 0 |
| SYSTEM 2 ON | 0 | 1 | 1 | 0 | 0 | 0 | 1 |
| dV/dt DETECTED | 1 | 1 | 0 | 0 | 1 | 0 | 0 |

FIG.10

| STATUS | NM1 DRN | NM2 DRN | NOT1 OUTPUT | NOT2 OUTPUT | OR OUTPUT | NOT3 OUTPUT | ER1 | ER2 |
|---|---|---|---|---|---|---|---|---|
| NORMALLY OFF | 1 | 1 | 0 | 0 | 1 | 0 | 0 | 0 |
| SYSTEM 1 ON | 0 | 1 | 1 | 0 | 1 | 0 | 1 | 0 |
| SYSTEM 2 ON | 1 | 0 | 0 | 1 | 1 | 0 | 0 | 1 |
| dV/dt DETECTED | 0 | 0 | 1 | 1 | 0 | 1 | 0 | 0 |

FIG.11

| ABNORMALITY CATEGORY | SIGNAL STATUS | PM1 | PM2 | OPERATION |
|---|---|---|---|---|
| NONE | OCE=OHE=UVE=0 | off | off | DO NOTHING |
| OVERCURRENT | OCE=1 | on | off | OUTPUT PM1 SIDE CONTINUOUS PULSE |
| OVERHEAT | OHE=1 | off | on | OUTPUT PM2 SIDE CONTINUOUS PULSE |
| LOW VOLTAGE | UVE=1 | on | off | OUTPUT PM1 AND PM2 PULSE ALTERNATELY |
| | | off | on | |

FIG.16

| | LATCH OUTPUT CATEGORY | BIT [0] | BIT [0] | OUTPUT ERDET | OUTPUT OHER | OUTPUT OCER | OUTPUT UVER | OUTPUT RXER | REMARKS |
|---|---|---|---|---|---|---|---|---|---|
| 0 | OHR | 0 | 0 | 0 | 0 | 0 | 0 | 0 | NO ABNORMALITY |
|   | OCR | 0 | 0 | | | | | | |
| 1 | OHR | 1 | 1 | 1 | 1 | 0 | 0 | 0 | OVERHEAT |
|   | OCR | 0 | 0 | | | | | | |
| 2 | OHR | 0 | 0 | 1 | 0 | 1 | 0 | 0 | OVERCURRENT |
|   | OCR | 1 | 1 | | | | | | |
| 3 | OHR | 1(0) | 0(1) | 1 | 0 | 0 | 1 | 0 | LOW VOLTAGE |
|   | OCR | 0(1) | 1(0) | | | | | | |
| 4 | OHR | 1 | 0(1) | 1 | 0 | 0 | 0 | 1 | RECEPTION ABNORMALITY |
|   | OCR | 1 | 1(0) | | | | | | |

FIG.25

| LATCH OUTPUT [LT4] | DECODER OUTPUT | | |
|---|---|---|---|
| | ALM1 | ALM2 | ALM3 |
| 3~4 | H | L | L |
| 5~6 | L | H | L |
| 7~8 | L | L | H |
| 9~ | L | L | L | ered
SIGNAL TRANSMISSION CIRCUIT

CROSS-REFERENCE TO RELATED APPLICATIONS

This application is based on, and claims priority benefit to International Patent application no. PCT/JP2014/066894 filed on Jun. 25, 2014 and foreign priority benefit to Japanese patent application no. 2013-133228, filed on Jun. 25, 2013, the contents of which are incorporated herein by reference in their entirely.

BACKGROUND

1. Field

Embodiments of the invention relate to a signal transmission circuit with a simple configuration wherein a multiple of signals can be level shifted and reliably transmitted between a high side circuit and low side circuit of differing operating reference voltages.

2. Description of Related Art

A power converter, including two power semiconductor elements Q1 and Q2, connected in a totem pole configuration to form a half-bridge circuit, that switch direct current voltage by alternately carrying out on/off operations, is known as a power converter that drives an alternating current load. For example, a high voltage integrated circuit (HVIC) including a high side driver (high side circuit), which carries out switching the drive of the upper arm side power semiconductor element Q1, and a low side driver (low side circuit), which carries out switching the drive of the lower arm side power semiconductor element Q2, is used as a drive circuit of this kind of power converter.

Herein, the high side circuit is configured to operate by receiving a predetermined power supply voltage VB (>VS), with a midpoint voltage (first voltage) VS of the half-bridge circuit as a reference potential. Also, the low side circuit is configured to operate by receiving a predetermined power supply voltage VCC (>GND), with a ground voltage (second voltage) GND of the half-bridge circuit lower than the midpoint voltage (first voltage) VS as a reference potential.

Herein, a protective circuit that protects the power semiconductor elements Q1 and Q2 by detecting an abnormality such as overcurrent or overheat in the power semiconductor elements Q1 and Q2, and a signal output circuit that transmits an abnormality detection signal to a control circuit portion of the high side circuit and low side circuit, are provided in the high side circuit and low side circuit. However, the high side circuit, as previously described, is configured to operate with the midpoint voltage VS of the half-bridge circuit as a reference potential. Also, the low side circuit is configured to operate with the ground voltage GND as a reference potential. Therefore, in order to transmit an abnormality detection signal, or the like, detected by the high side circuit to the low side circuit, it is necessary to reduce the level of the abnormality detection signal. Also, conversely, when transmitting a signal from the low side circuit to the high side circuit, it is necessary to increase the level of, for example, a control signal or the like.

Level shifter circuits wherein the level of a signal input into the low side circuit is increased and the signal is transmitted to the high side circuit are introduced in, for example, PTL 1 and 2. These level shifter circuits include a two system circuit formed of semiconductor switch elements MN1 and MN2, formed of n-type MOSFETs, connected in series with resistors R1 and R2 respectively and provided in parallel in the low side circuit, as shown in each of FIG. 27 and FIG. 28. Further, the configuration is such that an on-state signal in accordance with a signal to be transmitted from the low side circuit toward the high side circuit is transmitted via the one semiconductor switch element MN1, while an off-state signal is transmitted via the other semiconductor switch element MN2, and a latch circuit provided in the high side circuit is set and reset using these signals.

Herein, when transmitting a signal from the high side circuit toward the low side circuit, an on-state signal and an off-state signal are transmitted by semiconductor switch elements formed of p-type MOSFETs provided in parallel in the high side circuit being turned on and off. Further, the configuration is such that a latch circuit provided in the low side circuit is set and reset by the on-state signal and the off-state signal. In Japanese Patent Publication JP-A-9-200017 (PTL 1), an RS flip-flop is used as the latch circuit, as shown in FIG. 27. In Japanese Patent Publication JP-A-2011-44770 (PTL 2), a level trigger type of latch circuit configured by a p-type MOSFET and n-type MOSFET being connected in series is used, as shown in FIG. 28.

SUMMARY

Additional aspects and/or advantages will be set forth in part in the description which follows and, in part, will be apparent from the description, or may be learned by practice of the invention.

However, when using level shifter circuits with the configurations introduced in PTL 1 and PTL 2, for example, a quantity of level shifter circuits in accordance with the quantity of signals are necessary in order to transfer multiple kinds of signal, and there is a problem in that the circuit scale increases. Moreover, the high side circuit that operates with the midpoint voltage VS as a reference potential normally carries out a floating operation. Therefore, when transmitting signals between the high side circuit and low side circuit, potential fluctuation accompanying charging and discharging of a parasitic capacitor of the semiconductor switch element is liable to occur due to fluctuation in the high side circuit power supply voltage (dV/dt). Therefore, there is concern of the level shifter circuit malfunctioning, and noise being superimposed on signals transferred between the high side circuit and low side circuit.

Embodiments of the invention, having been contrived bearing in mind this kind of situation, have an aspect of providing a signal transmission circuit with a simple configuration such that it is possible to prevent an increase in circuit scale accompanying an increase in the quantity of signals level-shifted and transmitted between a high side circuit and low side circuit, and to level shift and reliably transmit signals between the high side circuit and low side circuit, without being affected by noise caused by power supply voltage fluctuation or the like.

One embodiment of the invention for achieving the heretofore described aspect, is a signal transmission circuit that shifts the level of and transmits a multiple of signals between first and second circuits, specifically a high side circuit and low side circuit, operating with mutually differing voltages as reference potentials, wherein the first circuit on a signal transmission side includes first and second semiconductor switch elements that transmit the reference potential or power supply voltage of the first circuit to the second circuit on a signal reception side by being alternatively driven so as to be turned on and off in accordance with the multiple of signals, and the second circuit on the signal reception side is characterized by including a voltage conversion circuit, including an in-phase noise filter that eliminates in-phase noise superimposed on the voltage transmitted from the first circuit via the first and second semiconductor switch elements, that generates first and second pulse signals in accordance with the voltage transmitted via the first and second semiconductor switch elements, a latch circuit that latches each of the first and second pulse signals with the first and second pulse signals generated by the voltage conversion circuit as a clock, and a signal output circuit that determines the category of the multiple of signals by analyzing the first and second pulse signals latched by the latch circuit, and generates an output signal in accordance with the determined signal category.

Herein, the alternative driving of the first and second semiconductor switch elements so as to be turned on and off is executed over a multiple of stages in accordance with the signal category. Preferably, the latch circuit is, for example, a shift register formed of multiple stages of D-type flip-flops connected in cascade. Further, the shift register sequentially stores the first and second pulse signals transmitted multiple times.

Also, the in-phase noise filter is realized as, for example, a logic circuit that prohibits the generation of the first and second pulse signals by the voltage conversion circuit when the voltages transmitted via the first and second semiconductor switch elements change simultaneously. Herein, the first and second semiconductor switch elements are, for example, high breakdown voltage semiconductor elements that are alternatively driven so as to be turned on and off by receiving pulse signals generated in accordance with the order of priority of a multiple of signals.

Herein, the first and second circuits are formed of, for example, circuits that drive first and second power semiconductors, specifically high breakdown voltage MOSFETs or IGBTs that supply power to a load, that are connected in series to form a half-bridge circuit and supply power to a load from a midpoint of the half-bridge circuit by being alternately driven so as to be turned on and off.

Preferably, the first circuit is a high side circuit that operates with the midpoint voltage of the half-bridge circuit as a reference potential, and the second circuit is a low side circuit that operates with the ground voltage as a reference potential. Further, the multiple of signals transmitted from the high side circuit to the low side circuit are signals indicating the category of an operating abnormality of the first power semiconductor driven so as to switch by the high side circuit.

Alternatively, the first circuit is a low side circuit that operates with the ground voltage as a reference potential, and the second circuit is a high side circuit that operates with the midpoint voltage of the half-bridge circuit as a reference potential. Further, the multiple of signals transmitted from the low side circuit to the high side circuit are signals controlling the drive of the first power semiconductor in the high side circuit.

According to an embodiment of the invention, when a multiple of signals are level shifted and transmitted between the first circuit and second circuit with differing reference potentials, the first circuit on the signal transmission side simply transmits the reference potential or power supply voltage of the first circuit to the second circuit via first and second semiconductor switch elements that are alternatively driven so as to be turned on and off in accordance with the multiple of signals.

Further, in the second circuit, after noise included in the signals transmitted via the first and second semiconductor switch elements is eliminated, first and second pulse signals in accordance with the voltages transmitted via the first and second semiconductor switch elements are generated. Then, each of the first and second pulse signals is latched with the first and second pulse signals as a clock, and the latched first and second pulse signals are analyzed, thereby determining the category of the multiple of signals. Consequently, signals transmitted from the first circuit can be easily and accurately restored.

Moreover, simply by employing an n-stage shift register as the latch circuit, and alternatively driving the first and second semiconductor switch elements so as to be turned on and off over n stages, a multiple of signals equivalent to $2^n$ can be transmitted, with no need to prepare level shifter circuits in accordance with the number of signals to be transmitted, as has been the case to date. Accordingly, there are advantages such as there being no increase in the circuit configuration scale in accompaniment to an increase in the number of signals to be transmitted.

Furthermore, as signal transmission is carried out by the first and second semiconductor switch elements being alternatively driven so as to be turned on and off, noise caused by fluctuation in the power supply voltage of the first circuit can be easily eliminated simply by using an in-phase noise filter. Consequently, advantages are achieved in that highly reliable signal transmission can be carried out with a simple configuration, and the like.

BRIEF DESCRIPTION OF THE DRAWINGS

These and/or other aspects and advantages will become apparent and more readily appreciated from the following description of the embodiments, taken in conjunction with the accompanying drawings of which:

FIG. 3 is a diagram showing an arbiter circuit processing function.

FIG. 4 is a diagram showing examples of a pulse signal generated by a pulse generator circuit in accordance with the output of the arbiter circuit.

FIG. 9 is a diagram showing the signal state in each portion with respect to a signal transmitted from a high side circuit to a low side circuit.

FIG. 10 is a diagram showing the signal state in each portion with respect to a signal transmitted from the low side circuit to the high side circuit.

FIG. 11 is a diagram showing examples of a pulse signal generated by a pulse generator circuit in accordance with a third embodiment of the invention.

FIG. 16 is a diagram showing a configuration example of a signal analysis circuit in the third embodiment of the invention.

FIG. 25 is a diagram showing a configuration example of a decoder in the fifth embodiment of the invention.

DESCRIPTION OF EMBODIMENTS

Figure 1:
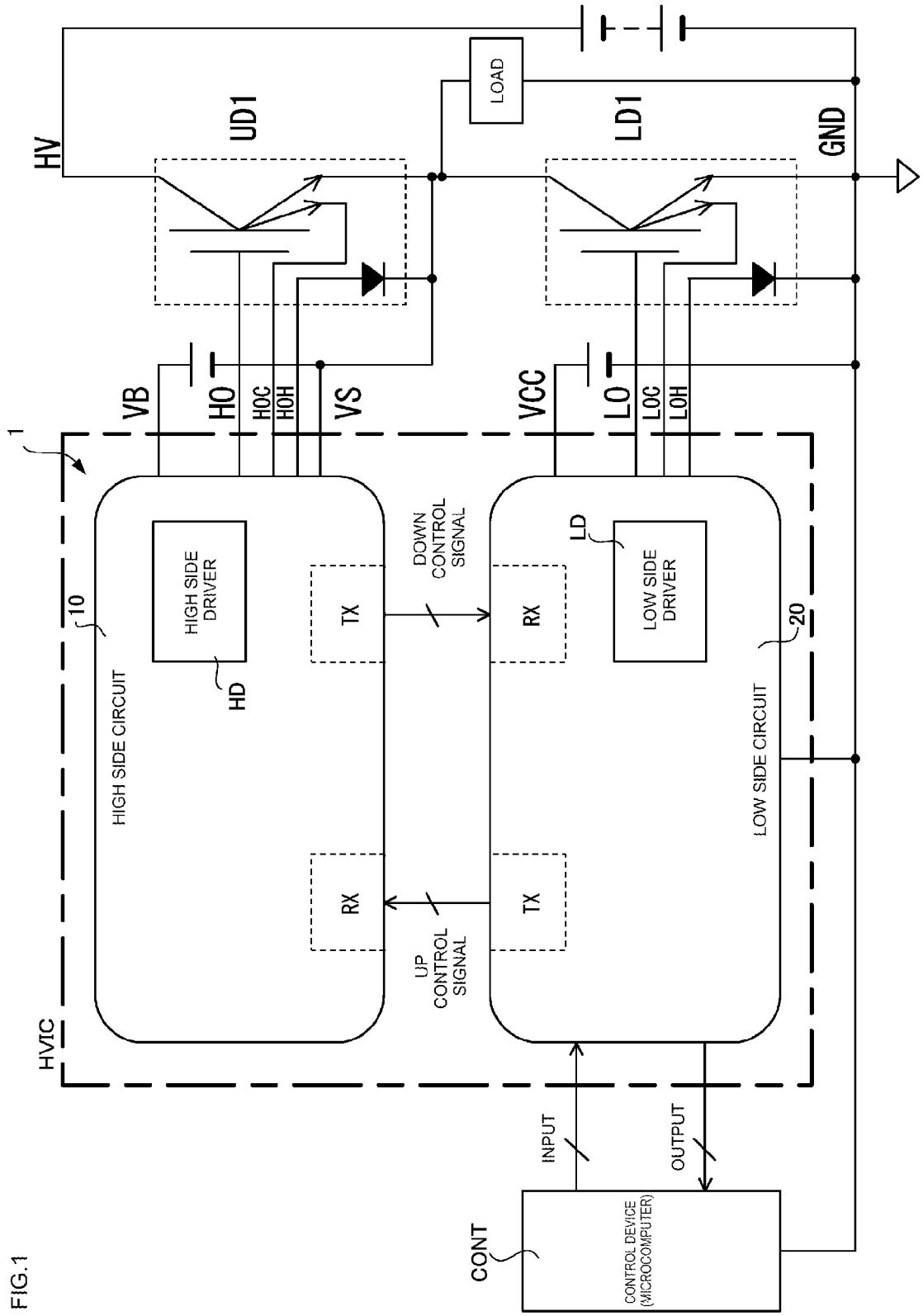
FIG. 1 is a main portion schematic configuration diagram of a power converter configured to include a signal transmission circuit according to an embodiment of the invention.

Hereafter, referring to the drawings, a description will be given of a signal transmission circuit according to embodiments of the invention.

First Embodiment

FIG. 1 is a main portion schematic configuration diagram of a power converter configured to include a signal transmission circuit according to an embodiment of the invention. In FIG. 1, UD1 and LD1 are switching elements, formed of, for example, IGBTs and connected in a totem pole configuration to form a half-bridge circuit, that switch a direct current voltage HV by alternately carrying out on/off operations, and supply power to a load.

The upper arm side switching element UD1 is driven to be turned on and off by a high side driver HD provided in a high side circuit 10 integrated in, for example, a high voltage integrated circuit HVIC. Also, the lower arm side switching element LD1 is driven to be turned on and off by a low side driver LD provided in a low side circuit 20 integrated in the high voltage integrated circuit HVIC.

The high voltage integrated circuit HVIC is configured to receive an operation control signal from a control device CONT such as, for example, a microcomputer, and alternately carry out switching drive of the switching elements UD1 and LD1 by controlling the operation of the high side driver HD and low side driver LD. Also, the high voltage integrated circuit HVIC is configured to monitor the operating status of each of the switching elements UD1 and LD1, and transmit operation information and the like to the control device CONT.

Herein, the high side circuit 10 including the high side driver HD is configured to operate by receiving the predetermined power supply voltage VB (>VS), with the half-bridge circuit midpoint voltage VS, which is a first potential, as a reference potential. Also, the low side circuit 20 including the low side driver LD is configured to operate by receiving the predetermined power supply voltage VCC (>GND), with the half-bridge circuit ground voltage GND, which is a second potential lower than the first potential, as a reference potential. Consequently, a signal transmission circuit, formed of a signal transmission unit TX and signal reception unit RX, for level shifting and transmitting various kinds of signals between the high side circuit 10 and low side circuit 20 is provided in the high side circuit 10 and low side circuit 20, which have differing reference potentials.

Herein, the high side driver HD and low side driver LD perform a role of respectively driving the switching elements UD1 and LD1 to be turned and off in accordance with an operation control signal input from the control device CONT. Also, the high side circuit 10 and low side circuit 20, for example, include a function of monitoring the current flowing through the switching elements UD1 and LD1 respectively, the operating temperature thereof, and the like. Herein, the current detection is carried out via, for example, a current detecting emitter provided in each of the switching elements UD1 and LD1. Also, the temperature detection is carried out via, for example, a temperature detecting diode integrally installed in each of the switching elements UD1 and LD1.

Further, the high side circuit 10 and low side circuit 20 include functions of protecting the switching elements UD1 and LD1 by stopping the driving of the switching elements UD1 and LD1 when an abnormality such as overcurrent or overheat is detected, and of transmitting an abnormality detection signal to the control device CONT. In particular, the high side circuit 10 reduces the level of the abnormality detection signal and transmits the signal to the low side circuit 20, and the abnormality detection signal is transmitted from the low side circuit 20 to the control device CONT.

Figure 2:
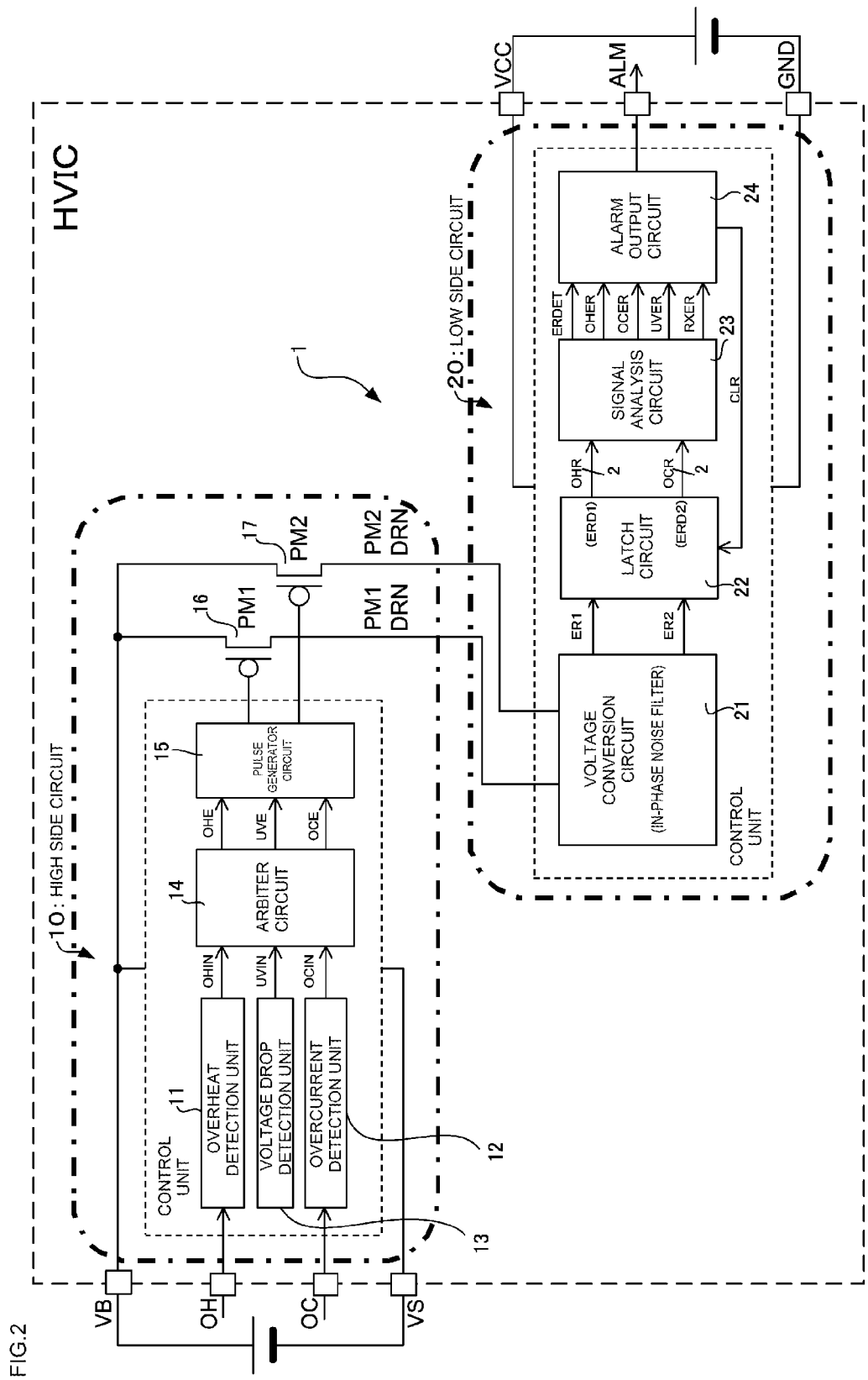
FIG. 2 is a main portion schematic configuration diagram of a signal transmission circuit according to a first embodiment of the invention.

FIG. 2 is a main portion schematic configuration diagram of a signal transmission circuit 1 according to a first embodiment of the invention, wherein 10 is the previously described high side circuit provided in the HVIC, and 20 is the low side circuit. The signal transmission circuit 1 shown in FIG. 2 performs a role of reducing the level of multiple kinds of abnormality detection signals OHE, OCE, and UVE detected in the high side circuit 10, and transmitting the signals to the low side circuit 20. The abnormality detection signal OHE is a signal indicating overheat detected by an overheat detection unit 11, the abnormality detection signal OCE is a signal indicating overcurrent detected by an overcurrent detection unit 12, and the abnormality detection signal UVE is a signal indicating an abnormal drop in voltage detected by a voltage drop detection unit 13.

The signal transmission circuit 1 includes an arbiter circuit 14 that outputs multiple kinds of abnormality detection inputs OHIN, OCIN, and UVIN input from the detection units 11, 12, and 13 in accordance with the level of priority thereof. The arbiter circuit 14, basically on a first come, first served basis, outputs the abnormality detection signals OHE, OCE, and UVE in accordance with the abnormality detection inputs OHIN, OCIN, and UVIN. However, when the multiple kinds of abnormality detection input OHIN, OCIN, and UVIN are generated simultaneously, the arbiter circuit 14 outputs the abnormality detection signals OHE, UVE, and OCE in an order of priority such that "OHIN>UVIN>OCIN", as shown in, for example, FIG. 3.

Also, the signal transmission circuit 1 includes a pulse generator circuit 15 that generates a pulse signal in accordance with the abnormality detection signals OHE, OCE, and UVE output from the arbiter circuit 14. Furthermore, the signal transmission circuit 1 includes, in parallel, two semiconductor switch elements 16 and 17 for transmitting the abnormality detection signals OHE, OCE, and UVE to the low side circuit 20. The semiconductor switch elements 16 and 17 are formed of, for example, high breakdown voltage p-type MOSFETs PM1 and PM2. The p-type MOSFETs PM1 and PM2 forming the semiconductor switch elements 16 and 17 are such that the source of each is connected to the power supply voltage VB, while the drain is connected to a voltage conversion circuit 21, to be described hereafter, of the low side circuit 20.

The pulse generator circuit 15 generates a multiple of pulse signals in accordance with the abnormality detection signals OHE, OCE, and UVE at a timing such that the semiconductor switch elements 16 and 17 are not turned on simultaneously, and applies the pulse signals to the gate of each of the semiconductor switch elements 16 and 17. The semiconductor switch elements 16 and 17 carry out an on-state operation when the pulse signals are applied to the gate, thereby transmitting the power supply voltage VB to the low side circuit 20.

Specifically, the pulse generator circuit 15, in order to obtain outputs ERD1 and ERD2 of a latch circuit 22 to be described hereafter, outputs over two timings a pulse signal "01" that turns off the semiconductor switch element 16 and turns on the semiconductor switch element 17 in a predetermined cycle when the abnormality detection signal OHE indicating overheat is output, as shown in, for example, FIG. 4 part (a). Also, when the abnormality detection signal OCE indicating overcurrent is output, the pulse generator circuit 15, after outputting the pulse signal "01" that turns off the semiconductor switch element 16 and turns on the semiconductor switch element 17, outputs a pulse signal "10" that turns on the semiconductor switch element 16 and turns off the semiconductor switch element 17.

Further, when the abnormality detection signal UVE indicating a voltage drop is output, the pulse generator circuit 15, after outputting the pulse signal "10" that turns on the semiconductor switch element 16 and turns off the semiconductor switch element 17, outputs the pulse signal "01" that turns off the semiconductor switch element 16 and turns on the semiconductor switch element 17. When still another abnormality detection signal is output, the pulse generator circuit 15 outputs over two timings the pulse signal "10" that turns on the semiconductor switch element 16 and turns off the semiconductor switch element 17.

In other words, the arbiter circuit 14 generates the abnormality detection signals OHE, OCE, and UVE in accordance with the state of occurrence of an overheat abnormality, overcurrent abnormality, and voltage drop abnormality. Further, the pulse generator circuit 15, under the management of the arbiter circuit 14, generates pulse signals that drive the semiconductor switch elements 16 and 17 to be turned on and off in accordance with the abnormality detection signals OHE, OCE, and UVE, as heretofore described, as shown in, for example, FIG. 5. That is, the pulse generator circuit 15, in accordance with the abnormality category, outputs over two timings the two bits of information "01" and "10" indicated by the alternative turning on and off of the semiconductor switch elements 16 and 17. As a result, the pulse generator circuit 15 outputs $2^2$ kinds, that is 4 kinds, of information in accordance with the abnormality category via the semiconductor switch elements 16 and 17.

When identifiably transmitting still more kinds of signal, it is sufficient to set so that the two bits of information indicated by the alternative turning on and off of the semiconductor switch elements 16 and 17 are output over three timings, as shown in, for example, FIG. 4 part (b). By so doing, the pulse generator circuit 15 can identifiably transmit $2^3$ kinds, that is 8 kinds, of information in accordance with the abnormality category via the semiconductor switch elements 16 and 17. Also, by the two bits of information being output over n timings, $2^n$ kinds of information can be transmitted.

Meanwhile, the low side circuit 20 includes a voltage conversion circuit 21 that converts the voltage of, and takes in, the pulse signals transmitted via the semiconductor switch elements 16 and 17, and generates a pulse signal with the ground voltage GND, which is the reference potential of the low side circuit 20, as a reference. The voltage conversion circuit 21 is configured to include a voltage conversion unit 21a and an in-phase noise filter 21b, as shown in, for example, FIG. 5, and is realized to include a pulse generation function of restoring a pulse signal transmitted from the high side circuit 10.

Figure 5:
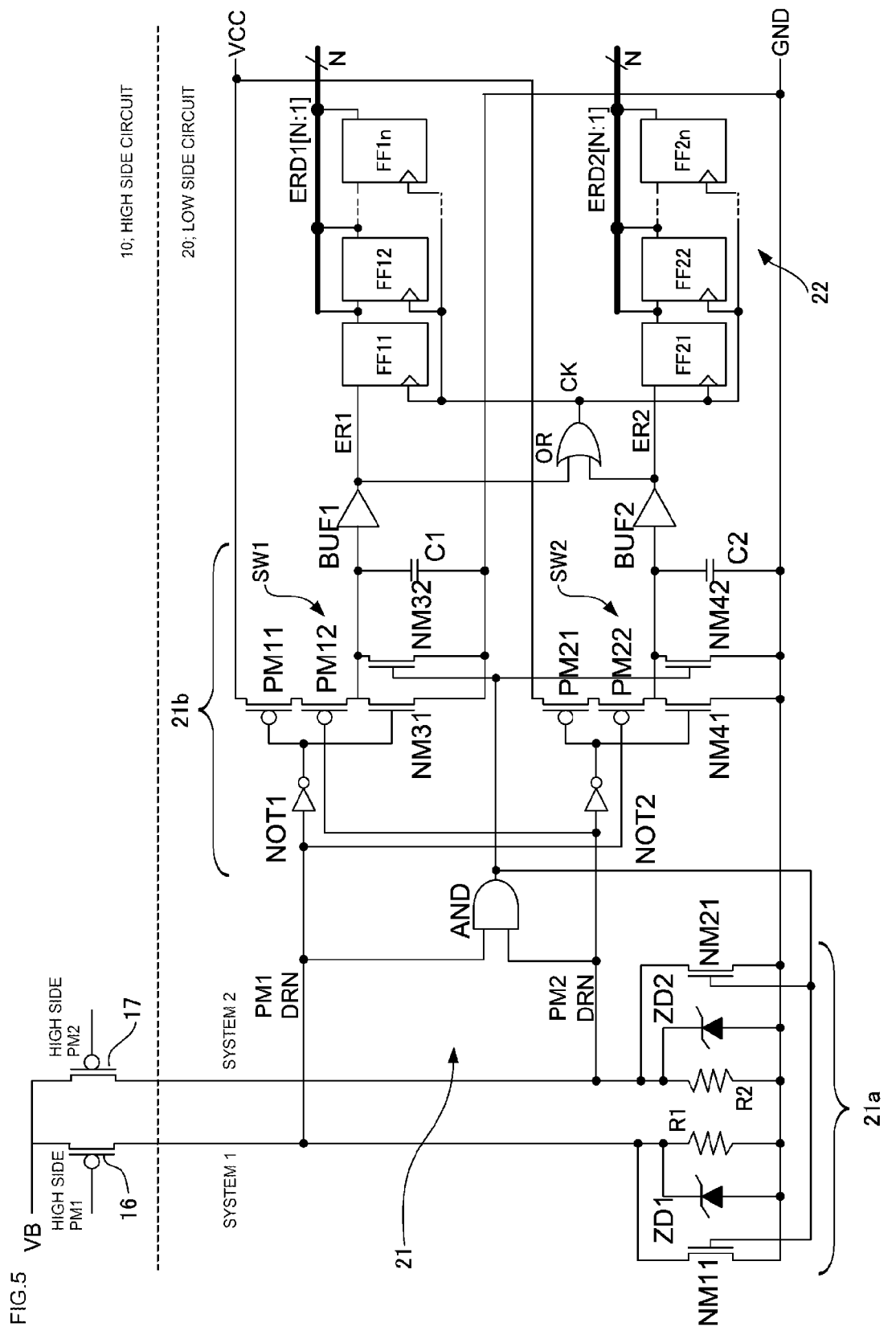
FIG. 5 is a diagram showing a specific configuration example of the signal transmission circuit shown in FIG. 2.

Specifically, as shown in, for example, FIG. 5, the voltage conversion unit 21a in the voltage conversion circuit 21 is formed of the resistors R1 and R2 connected in series with the drain of each of the semiconductor switch elements 16 and 17, and Zener diodes ZD1 and ZD2, connected in parallel with the resistors R1 and R2 respectively, that clamp voltage generated in the resistors R1 and R2. Further, the voltage conversion unit 21a is configured to restore the pulse signals, with the ground voltage GND as a reference, as the voltage generated in the resistors R1 and R2.

N-type MOSFETs NM11 and NM21 are connected in parallel with the resistors R1 and R2. The n-type MOSFETs NM11 and NM21 carry out an on-state operation by receiving into the gate thereof the output of an AND circuit AND that carries out an AND process on the voltage generated in the resistors R1 and R2, as will be described hereafter. Further, the n-type MOSFETs NM11 and NM21 perform a role of compulsorily setting the voltage generated in the resistors R1 and R2 to the ground voltage GND by the on-state operation.

In other words, when the voltages applied to the resistors R1 and R2 as the outputs of the semiconductor switch elements 16 and 17 are simultaneously high, the AND circuit AND determines that this is in-phase noise unrelated to the on/off operations of the semiconductor switch elements 16 and 17. Further, by each of the n-type MOSFETs NM11 and NM21 being caused to carry out an on-state operation by the output of the AND circuit AND, the voltage applied to the resistors R1 and R2 is lowered to the ground voltage GND, whereby the in-phase noise is eliminated.

Figure 6:
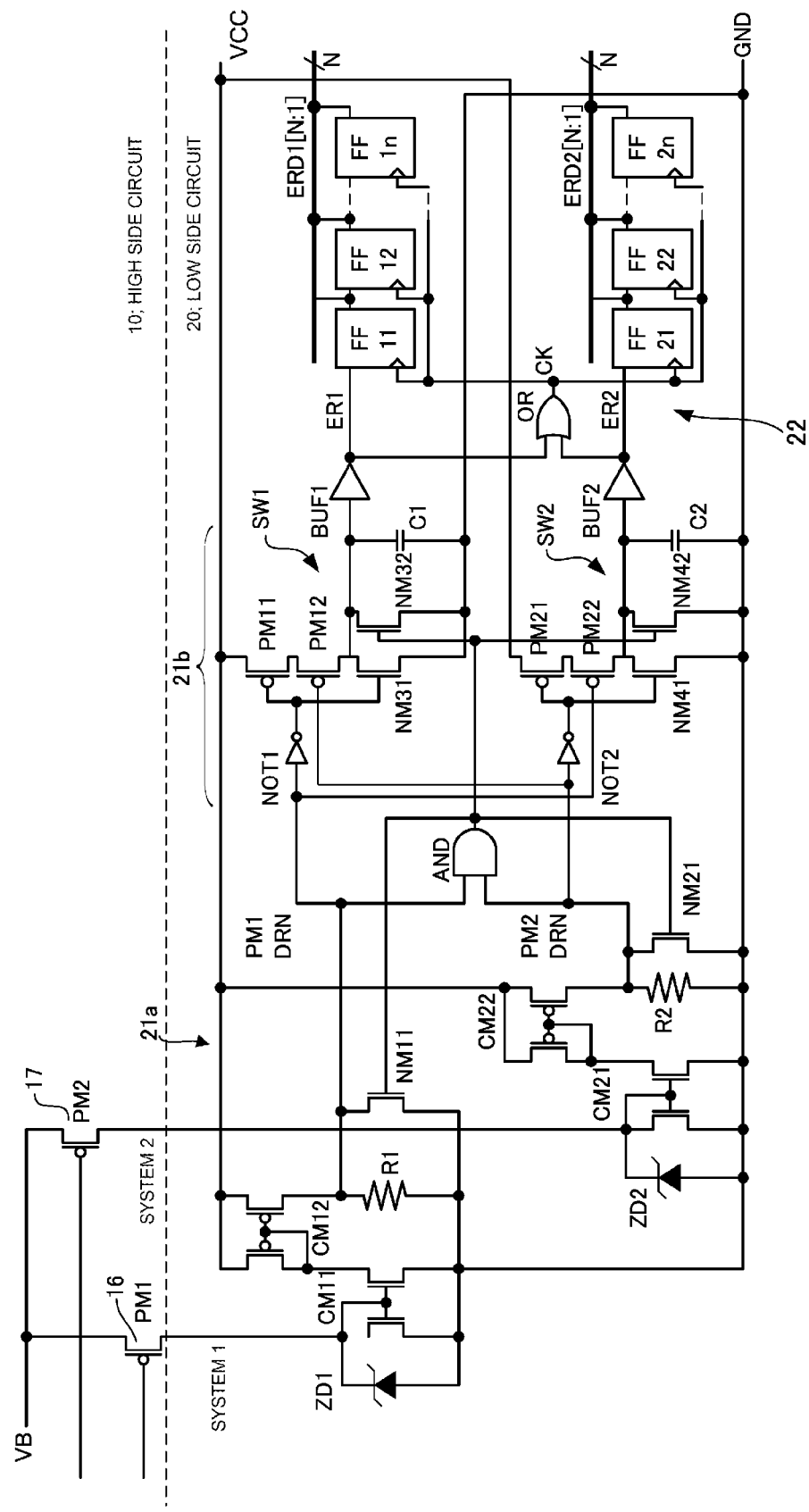
FIG. 6 is a diagram showing a modification example of the signal transmission circuit shown in FIG. 2.

The voltage conversion unit 21a can also be configured using first current mirror circuits CM11 and CM21, formed of a pair of n-type MOSFETs, and second current mirror circuits CM12 and CM22, formed of a pair of p-type MOSFETs, as shown in, for example, FIG. 6. In this case, the drain-to-source voltages of the first current mirror circuits CM11 and CM21 are clamped by the Zener diodes ZD1 and ZD2 respectively.

Further, the second current mirror circuits CM12 and CM22 are driven by the output of the first current mirror circuits CM11 and CM21, and voltage is generated in the resistors R1 and R2 by the output current of the second current mirror circuits CM12 and CM22. The voltage conversion unit 21a configured in this way is such that the pulse signals transmitted via the semiconductor switch elements 16 and 17 are restored as the voltage generated in the resistors R1 and R2 as pulse signals having the ground voltage GND as a reference.

Meanwhile, the in-phase noise filter 21b is realized by first and second switch circuits SW1 and SW2 formed of p-type MOSFETs and n-type MOSFETs being provided in parallel, as shown in, for example, each of FIG. 5 and FIG. 6. The first switch circuit SW1 is formed by p-type MOSFETs PM11 and PM12 and an n-type MOSFET NM31 being connected in a totem pole configuration, and an n-type MOSFET NM32 being connected in parallel with the n-type MOSFET NM31. Also, the second switch circuit SW2 is formed by p-type MOSFETs PM21 and PM22 and an n-type MOSFET NM41 being connected in a totem pole configuration, and an n-type MOSFET NM42 being connected in parallel with the n-type MOSFET NM41.

Further, the p-type MOSFET PM11 and n-type MOSFET NM31 in the first switch circuit SW1 carry out on/off operations in a complementary way by a pulse signal obtained from the resistor R1 being input into the gates thereof via a NOT circuit NOT1. Also, the p-type MOSFET PM12 in the first switch circuit SW1 carries out an on/off operation by a signal obtained from the resistor R2 being input. Furthermore, the n-type MOSFET NM32 carries out an on/off operation by a signal obtained via the AND circuit AND being input into the gate thereof.

Voltage generated in the resistor R1 is converted to a predetermined signal voltage and output by the first switch circuit SW1 configured in this way. Specifically, the first switch circuit SW1 outputs the power supply voltage VCC of the low side circuit 20 when a predetermined voltage is generated in the resistor R1, and outputs the ground voltage GND when no voltage is generated in the resistor R1. Further, when the n-type MOSFET NM32 carries out an on-state operation, the output of the signal of predetermined voltage from the first switching circuit SW1 is prohibited.

Meanwhile, the p-type MOSFET PM21 and n-type MOSFET NM41 in the second switch circuit SW2 carry out on/off operations in a complementary way by a pulse signal obtained from the resistor R2 being input into the gates thereof via a NOT circuit NOT2. Also, the p-type MOSFET PM22 carries out an on/off operation by a signal obtained from the resistor R1 being input. Furthermore, the n-type MOSFET NM42 carries out an on/off operation by a signal obtained via the AND circuit AND being input into the gate thereof.

The second switch circuit SW2 configured in this way also, in the same way as the first switch circuit SW1, converts voltage generated in the resistor R2 to a predetermined signal voltage, and outputs the signal voltage. Specifically, the second switch circuit SW2 outputs the power supply voltage VCC of the low side circuit 20 when a predetermined voltage is generated in the resistor R2, and outputs the ground voltage GND when no voltage is generated in the resistor R2. Further, when the n-type MOSFET NM41 carries out an on-state operation, the output of the signal of predetermined voltage from the second switching circuit SW2 is prohibited.

That is, when pulse signals PM1DRN and PM2DRN detected by the voltage conversion unit 21a and used in the generation of abnormality detection signals ER1 and ER2 invert simultaneously, the AND circuit AND generates a noise cancellation signal in synchronization with this. Further, in this case, the n-type MOSFETs NM11 and NM21 provided in the voltage conversion unit 21a are caused to carry out an on-state operation, and the n-type MOSFETs NM32 and NM42 provided in the first and second switch circuits SW1 and SW2 respectively are caused to carry out an on-state operation. Further, by operations of the first and second switch circuits SW1 and SW2 being prohibited, the outputs of the abnormality detection signals ER1 and ER2 are prohibited.

Consequently, when pulse signals are transmitted simultaneously via the semiconductor switch elements 16 and 17, and the predetermined voltage is generated in both of the resistors R1 and R2, the in-phase noise filter 21b formed of the first and second switch circuits SW1 and SW2 prohibits the output of the pulse signals. Further, the in-phase noise filter 21b outputs the pulse signal only when the pulse signal is input via only one of the semiconductor switch element 16 or semiconductor switch element 17. Pulse signals on which an in-phase filtering process has been carried out in this way, obtained at each of a connection point of the p-type MOSFET PM12 and n-type MOSFET NM31 and a connection point of the p-type MOSFET PM22 and n-type MOSFET NM41, are output in parallel via buffer amplifiers BUF1 and BUF2 as the two bit abnormality detection signals ER1 and ER2.

Returning here to the description of the configuration of the low side circuit 20, the low side circuit 20 includes a latch circuit 22 that latches a restored pulse signal whose voltage has been converted by the voltage conversion circuit 21, as shown in FIG. 2. Also, the low side circuit 20 includes a signal analysis circuit 23 that analyzes the pulse signal latched by the latch circuit 22, thereby determining the category of the abnormality detection signals ER1 and ER2. Furthermore, the low side circuit 20 includes an alarm output circuit 24 that outputs an alarm signal ALM in accordance with a signal analysis result, which is the output of the signal analysis circuit 23.

Specifically, the latch circuit 22 includes in parallel a shift register formed of multiple stages of flip-flops FF11, FF12, to FF1$n$ and a shift register formed of multiple stages of flip-flops FF21, FF22, to FF2$n$, which latch each of the abnormality detection signals ER1 and ER2 formed of the previously described pulse signals, as shown in, for example, each of FIG. 5 and FIG. 6. Herein, the flip-flops FF11 to FF1$n$ and FF21 to FF2$n$ are formed of, for example, D-type flip-flops. Further, the flip-flops FF11 to FF1$n$ and FF21 to FF2$n$ sequentially latch the abnormality detection signals ER1 and ER2, with the logical sum output of the abnormality detection signals ER1 and ER2, which is the output of the noise filter circuit obtained via an OR circuit OR, as a clock signal CK.

Specifically, the first stage flip-flops FF11 and FF21 forming the shift registers receive the clock signal CK generated by the OR circuit OR, and respectively latch the abnormality detection signals ER1 and ER2. Also, the flip-flops FF12 to FF1$n$ and FF22 to FF2$n$ from the second stage onward receive the clock signal CK, and latch the abnormality detection signals held in each of previous stage latch circuits FF1 (n–1) and FF2 (n–1).

Accordingly, every time the abnormality detection signals ER1 and ER2 change, signals indicating the status of the change in the abnormality detection signals ER1 and ER2 are sequentially latched by the previously described n-stage configuration flip-flops FF11 to FF1$n$ and FF21 to FF2$n$. Further, "2×n" bit signals latched and held in parallel in the n-stage flip-flops FF11 to FF1$n$ and FF21 to FF2$n$ configuring the latch circuit 22 are output as the previously described abnormality detection signals OHR, OCR, and the like, that indicate overheat and overcurrent respectively. The flip-flops FF11 to FF1n and FF21 to FF2n receive a clear signal CLR, to be described hereafter, generated by the alarm output circuit 24 after the output of the abnormality detection signals OHR and OCR, and are reset and initialized in unison.

Meanwhile, the signal analysis circuit 23 that analyzes the abnormality detection signals ER1 and ER2 held by the latch circuit 22 configured as heretofore described determines the category of the abnormality indicated by the abnormality detection signals ER1 and ER2 from the change in the temporal transitional state of the abnormality detection signals ER1 and ER2. That is, when the latch circuit 22 is in a reset state and the signals held in the latch circuit 22 are "00" and "00", the signal analysis circuit 23 determines that there is no abnormality. Further, when the signals held in the latch circuit 22 are "01" and "01", the signal analysis circuit 23 determines that this is an overheat abnormality.

Also, when the signals held in the latch circuit 22 are "01" and "10", the signal analysis circuit 23 determines that this is an overcurrent abnormality. Further, when the signals held in the latch circuit 22 are "10" and "01", the signal analysis circuit 23 determines that this is a low voltage abnormality. Further, when the abnormality detection signals ER1 and ER2 are "10" and "10", the signal analysis circuit 23 determines that this state is, for example, another abnormality.

Figure 7:
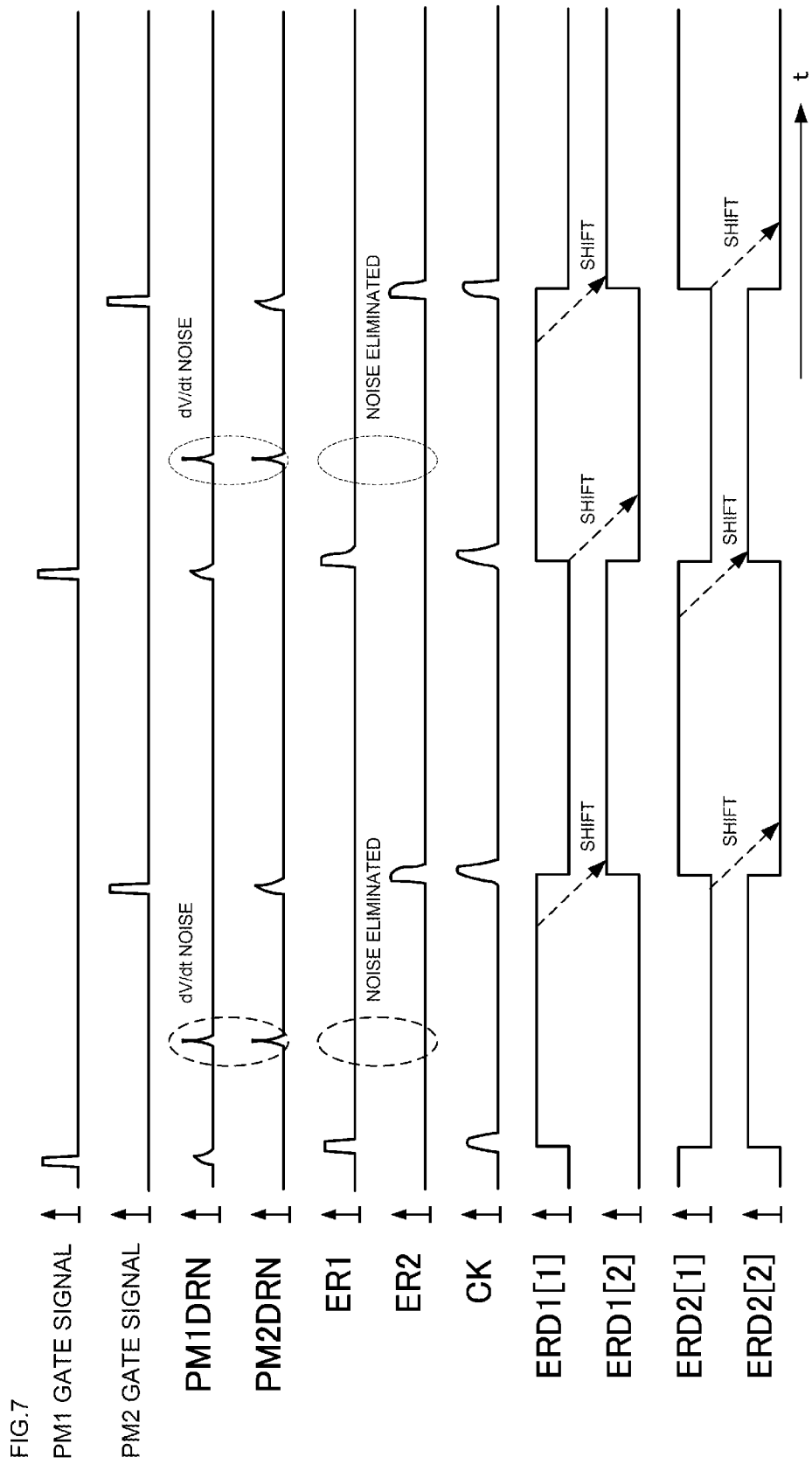
FIG. 7 is a diagram showing an aspect of signal transmission in the signal transmission circuit shown in FIG. 5.

According to the signal transmission circuit 1 configured in this way, the pulse signals that alternatively drives the semiconductor switch elements 16 and 17 to be turned on in accordance with the abnormality detection signals OHIN, OCIN, and UVIN are generated as a PM1 gate signal and PM2 gate signal, as shown by the aspect of signal transmission from the high side circuit 10 to the low side circuit 20 in FIG. 7. Further, the power supply voltage VB being applied to the high side circuit 10 is transmitted to the low side circuit 20 as the output voltages PM1DRN and PM2DRN of the semiconductor switch elements 16 and 17 in accompaniment to an on-state operation of the semiconductor switch elements 16 and 17.

At this time, it may happen that noise accompanying fluctuation in the power supply voltage VB of the high side circuit 10, so-called dV/dt noise, is superimposed on the output voltages PM1DRN and PM2DRN transmitted to the low side circuit 20. Thereupon, as the dV/dt noise is in-phase noise transmitted to the low side circuit 20, output from the in-phase noise filter 21b is prohibited by an on-state operation of the n-type MOSFETs NM32 and NM42 in the in-phase noise filter 21b.

Accordingly, the outputs ER1 and ER2 of the in-phase noise filter 21b, the dV/dt noise being eliminated as shown in FIG. 7, form only components of pulse signals in accordance with the abnormality detection signals OHIN, OCIN, and UVIN. Further, the latch circuit 22 generates the clock signal CK by carrying out a logical sum processing of the outputs ER1 and ER2 of the in-phase noise filter 21b via the OR circuit OR, and drives the n-stage configuration flip-flops FF11 to FF1n and FF21 to FF2n to latch using the clock signal CK. As a result of this, data indicating the outputs ER1 and ER2 of the in-phase noise filter 21b are latched as ERD1(1) and ERD1(2) in, for example, the first stage flip-flops FF11 and FF21. Further, the data ERD1(1) and ERD1(2) are shifted to the second stage flip-flops FF12 and FF22 at the next timing, and latched as data ERD2(1) and ERD2(2).

As a result of this, the parallel 2-bit signals held over n stages in the latch circuit 22 are provided to the signal analysis circuit 23 as (2×n) bit output signals ERD1(N:1) and ERD2(N:1). Then, the signal analysis circuit 23, by identifying the (2×n) bit output signals ERD1(N:1) and ERD2(N:1), determines the category of the abnormality indicated by the signals, and drives the alarm output circuit 24 in accordance with the result of the determination. Herein, the abnormality categories include, for example, an abnormality detection error ERDET, overheat detection OHER, overcurrent detection OCER, voltage drop detection UVER, signal transmission error RXER, and the like. Further, the alarm output circuit 24, after outputting the abnormality detection information to the exterior, generates the previously described reset signal, thereby resetting the latch circuit 22.

In this way, according to the signal transmission circuit 1 with the heretofore described configuration, signal transmission to the low side circuit 20 can be reliably carried out, unaffected by power supply voltage fluctuation (dV/dt) in the high side circuit 10. Also, as the semiconductor switch elements 16 and 17 are not simultaneously driven to be turned on, the effect of in-phase noise commingled in the two semiconductor switch elements 16 and 17 is easily and effectively eliminated, and each of the pulse signals can be reliably detected.

Therefore, the category of an abnormality occurring in the high side circuit 10 can be accurately identified in the low side circuit 20 from pulse signals transmitted via each of the semiconductor switch elements 16 and 17. In particular, as the categories of multiple kinds of abnormality occurring in the high side circuit 10 can be easily and reliably transmitted to the low side circuit 20 using the two semiconductor switch elements 16 and 17, there are a large number of practical advantages.

Herein, the signal transmission circuit shown in the heretofore described embodiment is such that the level of a signal is reduced, and the signal transmitted from the high side circuit 10 to the low side circuit 20. However, the invention is also applicable in the same way to a signal transmission circuit wherein the level of a signal is increased, and the signal transmitted from the low side circuit 20 to the high side circuit 10.

Second Embodiment

Figure 8:
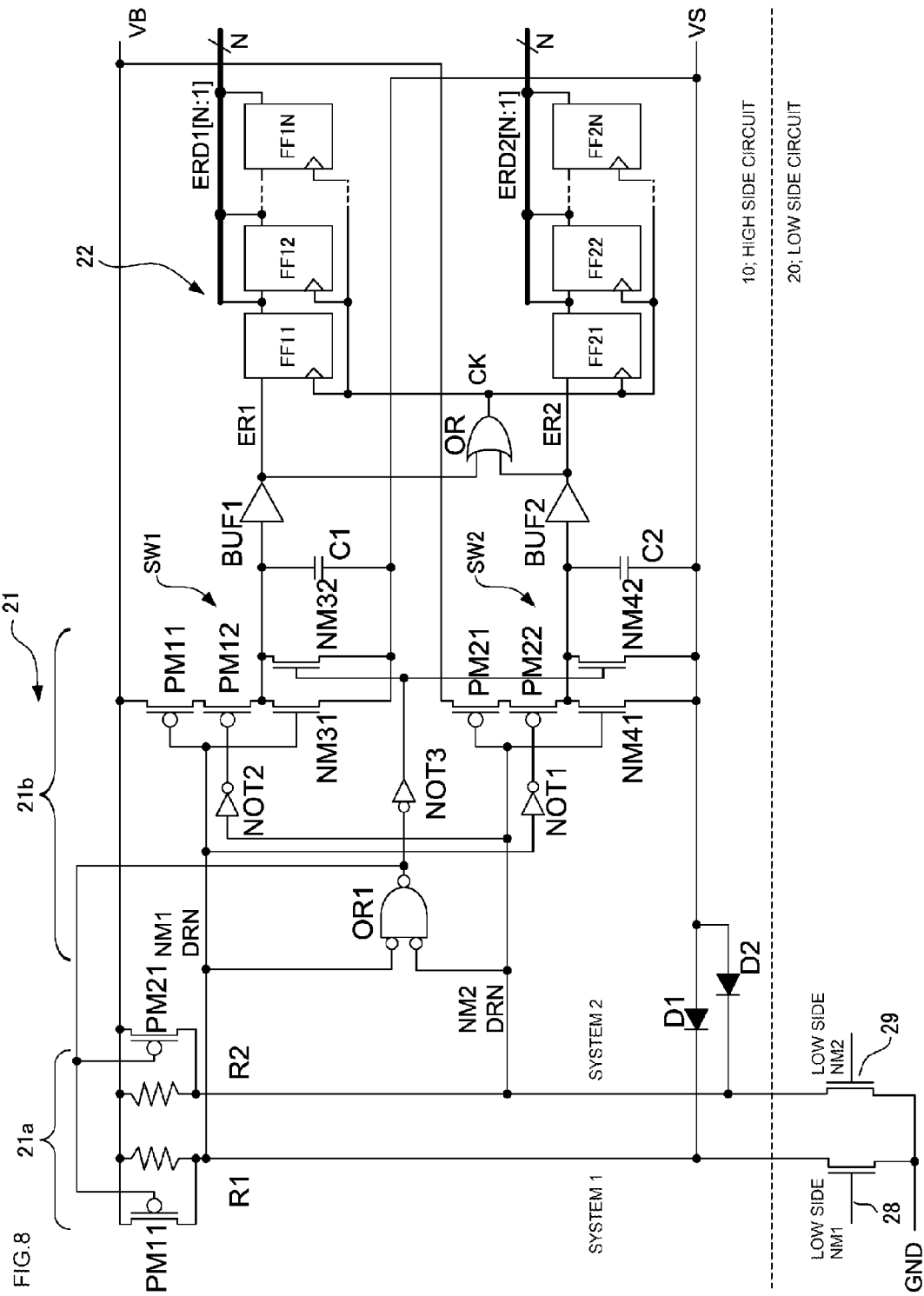
FIG. 8 is a main portion schematic configuration diagram of a signal transmission circuit according to a second embodiment of the invention.

FIG. 8 is a main portion schematic configuration diagram of a signal transmission circuit according to a second embodiment of the invention, wherein the configuration is such that the signal transmission unit TX is provided in the low side circuit 20, and the signal reception unit RX is provided in the high side circuit 10, as shown in FIG. 1. In this case, the signal transmission unit TX is configured to include in parallel two semiconductor switch elements 28 and 29 that are alternatively turned on and off in accordance with the category of a signal to be transmitted to the high side circuit 10, thereby transmitting the signal to the high side circuit 10. The semiconductor switch elements 28 and 29 are formed of, for example, high breakdown voltage n-type MOSFETs NM1 and NM2. The n-type MOSFETs NM1 and NM2 forming the semiconductor switch elements 28 and 29 are such that the drain of each is connected to the line of the ground voltage GND, while the source is connected to a voltage conversion circuit provided in the high side circuit 10.

The voltage conversion circuit provided in the high side circuit 10 includes the resistors R1 and R2 inserted in series between the sources of the n-type MOSFETs NM1 and NM2 and the line of the power supply voltage VB of the high side circuit 10. Also, the power conversion circuit includes diodes D1 and D2 that clamp voltage generated in the resistors R1 and R2 when the n-type MOSFETs NM1 and NM2 carry out an on-state operation to the midpoint voltage VS, which is the reference potential of the high side circuit 10.

Furthermore, the voltage conversion circuit includes p-type MOSFETs PM11 and PM21 connected in parallel with the resistors R1 and R2 respectively. The p-type MOSFETs PM11 and PM21 correspond to the n-type MOS-FETs NM11 and NM21 in the previous embodiment, and carry out an on/off operation by receiving into the gate thereof the output of an OR circuit OR1 that carries out an AND process on output signals NM1DRN and NM2DRN of the voltage conversion circuit. The OR circuit OR1 carries out an AND process on the output signals NM1DRN and NM2DRN provided as negative logic, thus corresponding to the AND circuit AND in the previous embodiment.

Further, an in-phase noise filter that eliminates in-phase noise from the output of the voltage conversion circuit, and a latch circuit that latches the pulse signals ER1 and ER2 transmitted to the high side circuit 10, are basically configured in the same way as in the previous embodiment. Accordingly, a detailed description thereof will be omitted. In this embodiment, however, the pulse signals ER1 and ER2 transmitted to the high side circuit 10 are provided as negative logic, because of which the n-type MOSFETs NM32 and NM42, which are provided in the first and second switch circuits SW1 and SW2 and prohibit the output of the pulse signals ER1 and ER2, are turned on and off using a signal which is the output of the OR circuit OR1 inverted via a NOT circuit NOT3.

In this way, according to the signal transmission circuit configured in this way, a predetermined voltage drop can be caused in the resistors R1 and R2 by alternatively causing the n-type MOSFETs NM1 and NM2 to carry out an on-state operation in accordance with a signal to be transmitted to the high side circuit 10. Accordingly, a signal transmitted from the low side circuit 20 can be restored by detecting the predetermined voltage drop caused in the resistors R1 and R2. Furthermore, voltage drops occurring simultaneously in the resistors R1 and R2 due to voltage fluctuation can be detected as in-phase noise by the OR circuit OR1. In the same way as in the previous embodiment, signal transmission from the low side circuit 20 to the high side circuit 10 can be carried out easily and reliably, unaffected by in-phase noise.

Herein, when carrying out signal transmission from the high side circuit 10 toward the low side circuit 20, the signal state in each portion with respect to a signal whose level is reduced and which is transmitted to the low side circuit 20 is as shown in FIG. 9. Accordingly, when the outputs PM1DRN and PM2DRN of the voltage conversion unit 21*a* are "11", that is, when the outputs PM1DRN and PM2DRN reach a predetermined voltage clamped by the Zener diodes ZD1 and ZD2, it is sufficient that this is detected as a generation of in-phase noise.

Also, conversely, when carrying out signal transmission from the low side circuit 20 toward the high side circuit 10, the signal state in each portion with respect to a signal whose level is increased and which is transmitted to the high side circuit 10 is as shown in FIG. 10. Accordingly, when the outputs NM1DRN and NM2DRN of the voltage conversion circuit are "00", that is, when the outputs NM1DRN and NM2DRN reach the midpoint voltage VS clamped by the diodes D1 and D2, it is sufficient that this is detected as a generation of in-phase noise.

As heretofore described, the signal transmission circuit according to an embodiment of the invention is such that a predetermined voltage is generated in resistors connected to each of first and second semiconductor switch elements provided in a second circuit by first and second semiconductor switch elements provided in a first circuit being alternatively driven to be turned on and off, and a signal is level shifted and transmitted from the first circuit to the second circuit by the voltage being detected. Also, when the voltage is generated simultaneously in the resistors, this is determined to be in-phase noise caused by voltage fluctuation or the like, and the in-phase noise is eliminated by the output of a voltage detection circuit being prohibited. Accordingly, it is possible to shift the level of, and reliably transmit, a signal, unaffected by in-phase noise.

Also, by signal transmission by the first and second semiconductor switch elements being alternatively driven so as to be turned on and off being executed over n stages in accordance with the category of the signal, two bits of information formed of "01" or "10" are transmitted over n stages. As a result of this, even when the number of signals to be level shifted and transmitted between the first circuit and second circuit increases, $2^n$ kinds of information can be reliably transmitted, without increasing the number of level shifter circuits as has been the case to date. In other words, there is no need to increase the number of level shifter circuits even when there is an increase in signal categories, and an advantage is achieved in that an unnecessary complication and increase in size of the signal transmission circuit can be prevented, and the like.

Third Embodiment

Herein, a pulse signal generated by the pulse generator circuit 15 in accordance with the signal category can also be as follows. Specifically, the pulse signal is a continuous pulse signal that continuously turns the semiconductor switch element 17 on and off in a first cycle when the abnormality detection signal OHE indicating overheat is output, as shown in, for example, FIG. 11. Also, the pulse signal is a continuous pulse signal that continuously turns the semiconductor switch element 16 on and off in a first cycle when the abnormality detection signal OCE indicating overcurrent is output. Further, the pulse signal is a pulse signal that alternately turns the two semiconductor switch elements 16 and 17 on and off in a second cycle longer than the first cycle when the abnormality detection signal UVE indicating a voltage drop is output.

That is, the arbiter circuit 14 generates the abnormality detection signals OHE, OCE, and UVE in accordance with the state of occurrence of an overheat abnormality, overcurrent abnormality, and voltage drop abnormality. Further, the pulse generator circuit 15, under the management of the arbiter circuit 14, generates pulse signals that drive each of the semiconductor switch elements 16 and 17 to be turned on and off in accordance with the abnormality detection signals OHE, OCE, and UVE, as shown in, for example, FIG. 12.

Figure 12:
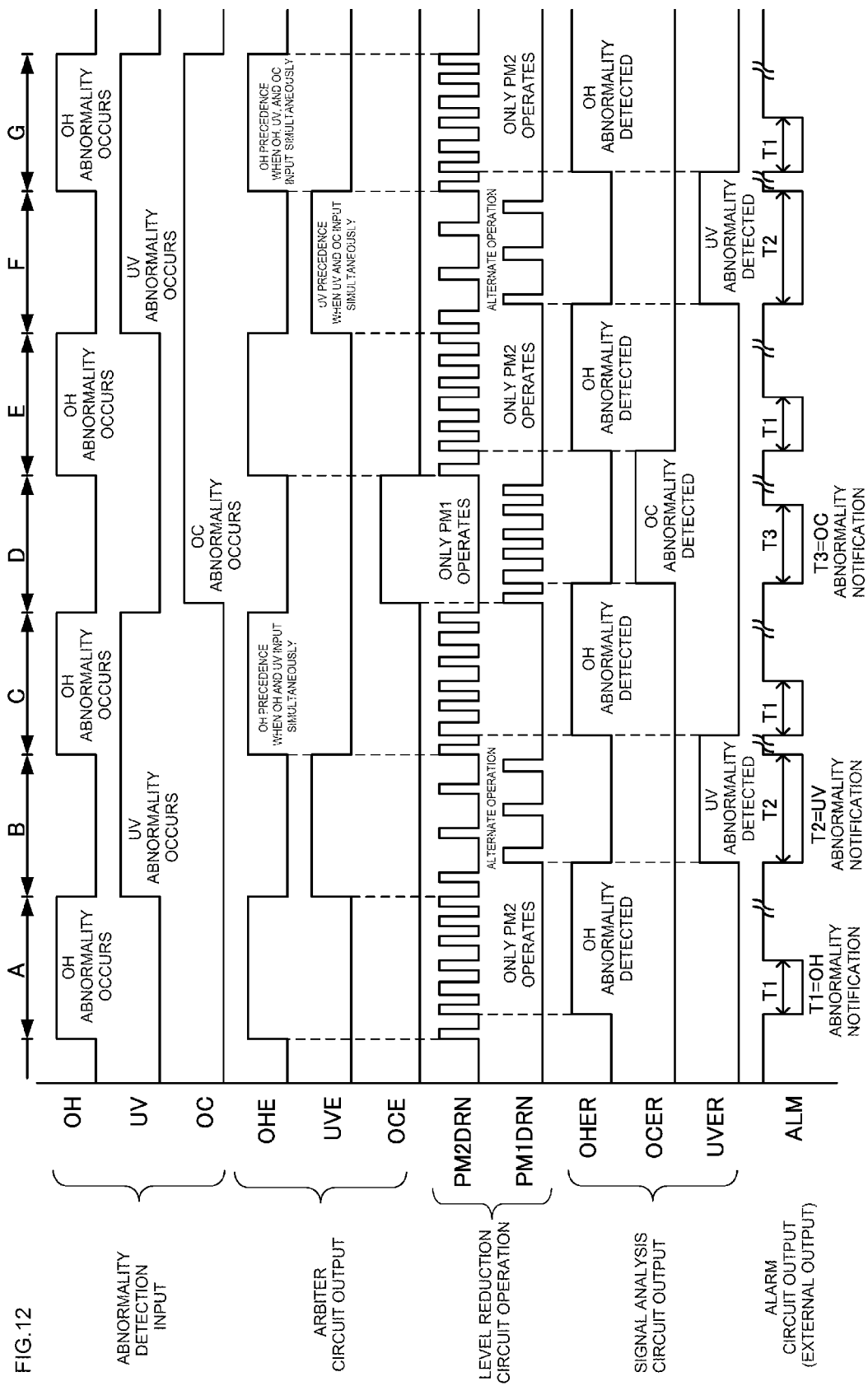
FIG. 12 is a timing diagram showing an aspect of signal transmission in the third embodiment of the invention.

Specifically, when only an overheat abnormality occurs, only the semiconductor switch element 17 is driven to be turned on and off in the first cycle, as shown in an interval A in FIG. 12. Also, when only a voltage drop abnormality occurs, the semiconductor switch elements 16 and 17 are driven to be alternately turned on and off in the second cycle, as shown in an interval B. Further, when the overheat abnormality and voltage drop abnormality occur simultaneously, the overheat abnormality takes precedence over the voltage drop abnormality, and only the semiconductor switch element 17 is driven to be turned on and off in the first cycle, as shown in an interval C.

Also, when only an overcurrent abnormality occurs, only the semiconductor switch element 16 is driven to be turned on and off in the first cycle, as shown in an interval D in FIG. 12. Also, when the overheat abnormality occurs simultaneously in addition to an overcurrent abnormality, only the semiconductor switch element 17 is driven to be turned on and off in the first cycle, in precedence to the drive of the semiconductor switch element 16, as shown in an interval E. Also, when the overcurrent abnormality and voltage drop abnormality occur simultaneously, the semiconductor switch elements 16 and 17 are alternately driven to be turned on and off in the second cycle, as shown in an interval F. Further, when a voltage drop abnormality occurs simultaneously together with the overheat abnormality and overcurrent abnormality, the overheat abnormality takes precedence, and only the semiconductor switch element 17 is driven to be turned on and off in the first cycle, as shown in an interval G.

Meanwhile, the low side circuit 20 includes the voltage conversion circuit 21 that converts the voltage of, and takes in, the heretofore described pulse signals transmitted via the semiconductor switch elements 16 and 17, and generates a pulse signal with the ground potential GND, which is the reference potential of the low side circuit 20, as a reference. The voltage conversion circuit 21 is configured to include the voltage conversion unit 21a and in-phase noise filter 21b, as shown in, for example, FIG. 13, and is realized to include a pulse generation function of restoring the pulse signals.

Figure 13:
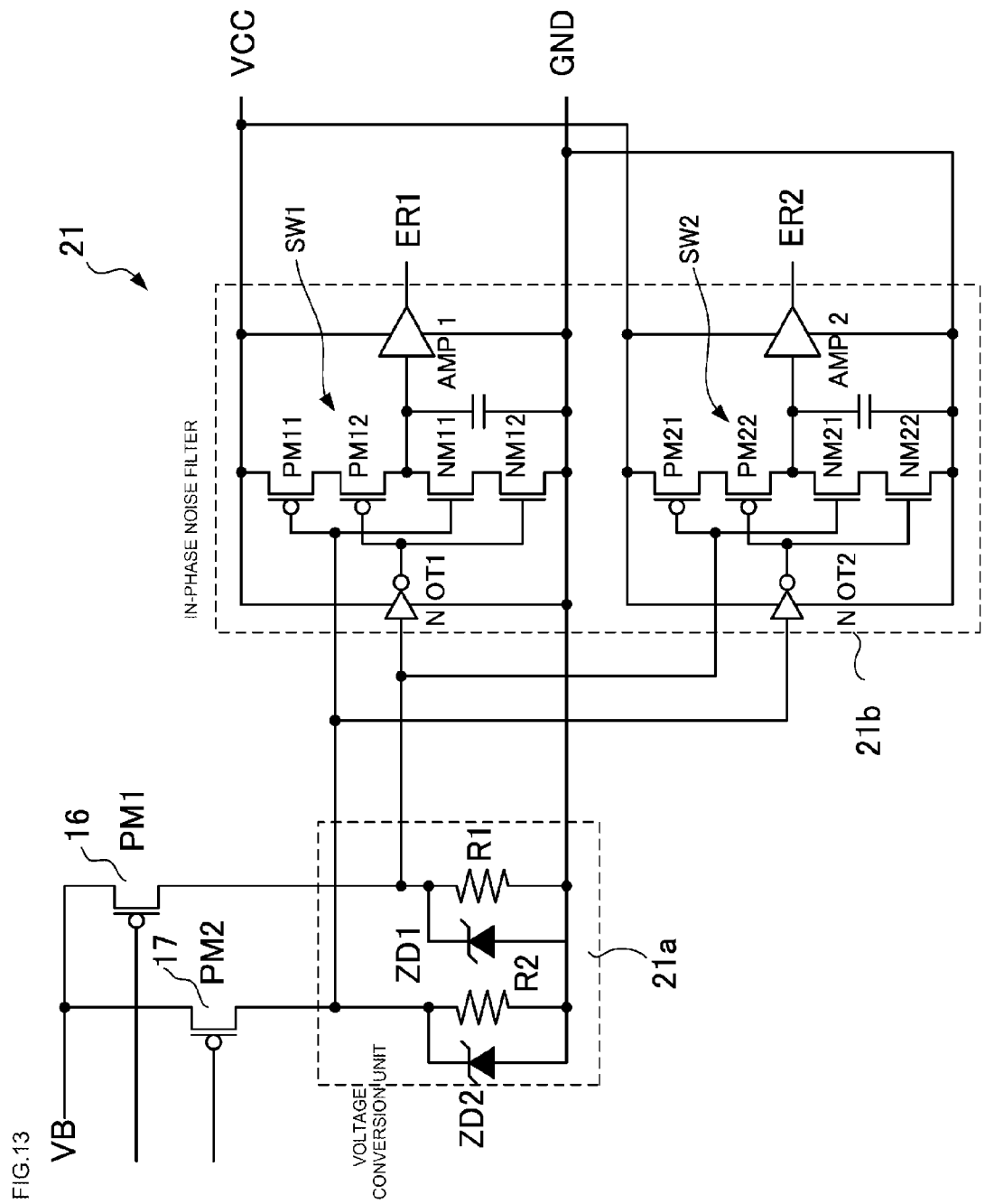
FIG. 13 is a diagram showing a configuration example of a voltage conversion circuit in the third embodiment of the invention.

Specifically, as shown in, for example, FIG. 13, the voltage conversion unit 21a in the voltage conversion circuit 21 is formed of the resistors R1 and R2 connected in series with the drain of each of the semiconductor switch elements 16 and 17, and the Zener diodes ZD1 and ZD2, connected in parallel with the resistors R1 and R2 respectively, that clamp voltage generated in the resistors R1 and R2. Further, the voltage conversion unit 21a is configured to restore the pulse signals, with the ground potential GND as a reference, as the voltage generated in the resistors R1 and R2.

Figure 14:
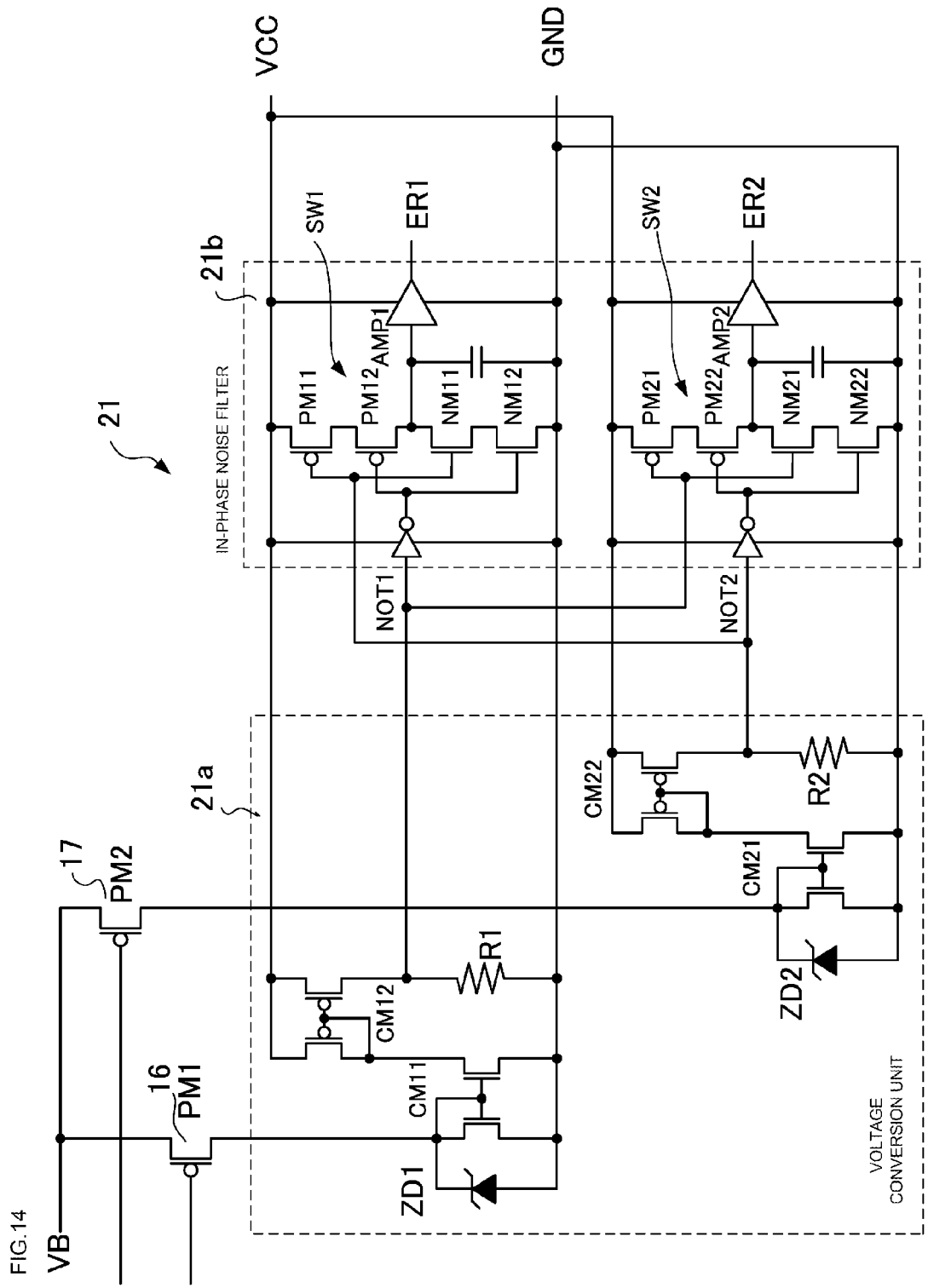
FIG. 14 is a diagram showing a modification example of the voltage conversion circuit in the third embodiment of the invention.

The voltage conversion unit 21a can also be configured using the first current mirror circuits CM11 and CM21, formed of a pair of n-channel MOSFETs, and second current mirror circuits CM12 and CM22, formed of a pair of p-channel MOSFETs, as shown in, for example, FIG. 14. In this case, the drain-to-source voltages of the first current mirror circuits CM11 and CM21 are clamped by the Zener diodes ZD1 and ZD2.

Further, the second current mirror circuits CM12 and CM22 are driven by the output of the first current mirror circuits CM11 and CM21, and voltage is generated in the resistors R1 and R2 by the output current of the second current mirror circuits CM12 and CM22. Accordingly, the voltage conversion unit 21a configured in this way is also such that the pulse signals transmitted via the semiconductor switch elements 16 and 17 are restored as the voltage generated in the resistors R1 and R2 as pulse signals having the ground potential GND as a reference.

Also, the in-phase noise filter 21b is configured as the switch circuits SW1 and SW2 by two stages each of p-channel MOSFETs and n-channel MOSFETs, a total of four stages, being connected in a totem pole configuration, as shown in, for example, each of FIG. 13 and FIG. 14. The first stage p-channel MOSFET PM11 and third stage n-channel MOSFET NM11 in the first switch circuit SW1 carry out on/off operations in a complementary way by a pulse signal obtained from the resistor R2 being input into the gates thereof. Also, the second stage p-channel MOSFET PM12 and fourth stage n-channel MOSFET NM12 carry out on/off operations in a complementary way by a pulse signal obtained from the resistor R1 and inverted via the NOT circuit NOT1 being input into the gates thereof.

Accordingly, when pulse signals are input simultaneously via the semiconductor switch elements 16 and 17, the first switch circuit SW1 prohibits the output of the pulse signals. Further, when the pulse signal is input via only the semiconductor switch element 16, the first switch circuit SW1 outputs the pulse signal. A pulse signal on which an in-phase filtering process has been carried out in this way, obtained at a connection point of the p-channel MOSFET PM12 and third stage n-channel MOSFET NM11, is output via an output amplifier AMP1 as the abnormality detection signal ER1.

Also, in the same way, the first stage p-channel MOSFET PM21 and third stage n-channel MOSFET NM21 in the second switch circuit SW2 carry out on/off operations in a complementary way by a pulse signal obtained from the resistor R1 being input into the gates thereof. Also, the second stage p-channel MOSFET PM22 and fourth stage n-channel MOSFET NM22 carry out on/off operations in a complementary way by a pulse signal obtained from the resistor R2 and inverted via the NOT circuit NOT2 being input into the gates thereof.

Accordingly, when pulse signals are input simultaneously via the semiconductor switch elements 16 and 17, the second switch circuit SW2, in the same way as the first switch circuit SW1, prohibits the output of the pulse signals. Further, when the pulse signal is input via only the semiconductor switch element 17, the second switch circuit SW2 outputs the pulse signal. A pulse signal on which an in-phase filtering process has been carried out in this way, obtained at a connection point of the second stage p-channel MOSFET PM22 and third stage n-channel MOSFET NM21, is output via an output amplifier AMP2 as the abnormality detection signal ER2.

Returning here to the description of the configuration of the low side circuit 20, the low side circuit 20 includes the latch circuit 22 that latches a restored pulse signal whose voltage has been converted by the voltage conversion circuit 21, as shown in FIG. 2. Also, the low side circuit 20 includes the signal analysis circuit 23 that analyzes the pulse signal latched by the latch circuit 22, thereby determining the category of the previously described abnormality detection signals. Furthermore, the low side circuit 20 includes the alarm output circuit 24 that outputs the alarm signal ALM in accordance with a signal analysis result, which is the output of the signal analysis circuit 23.

Figure 15:
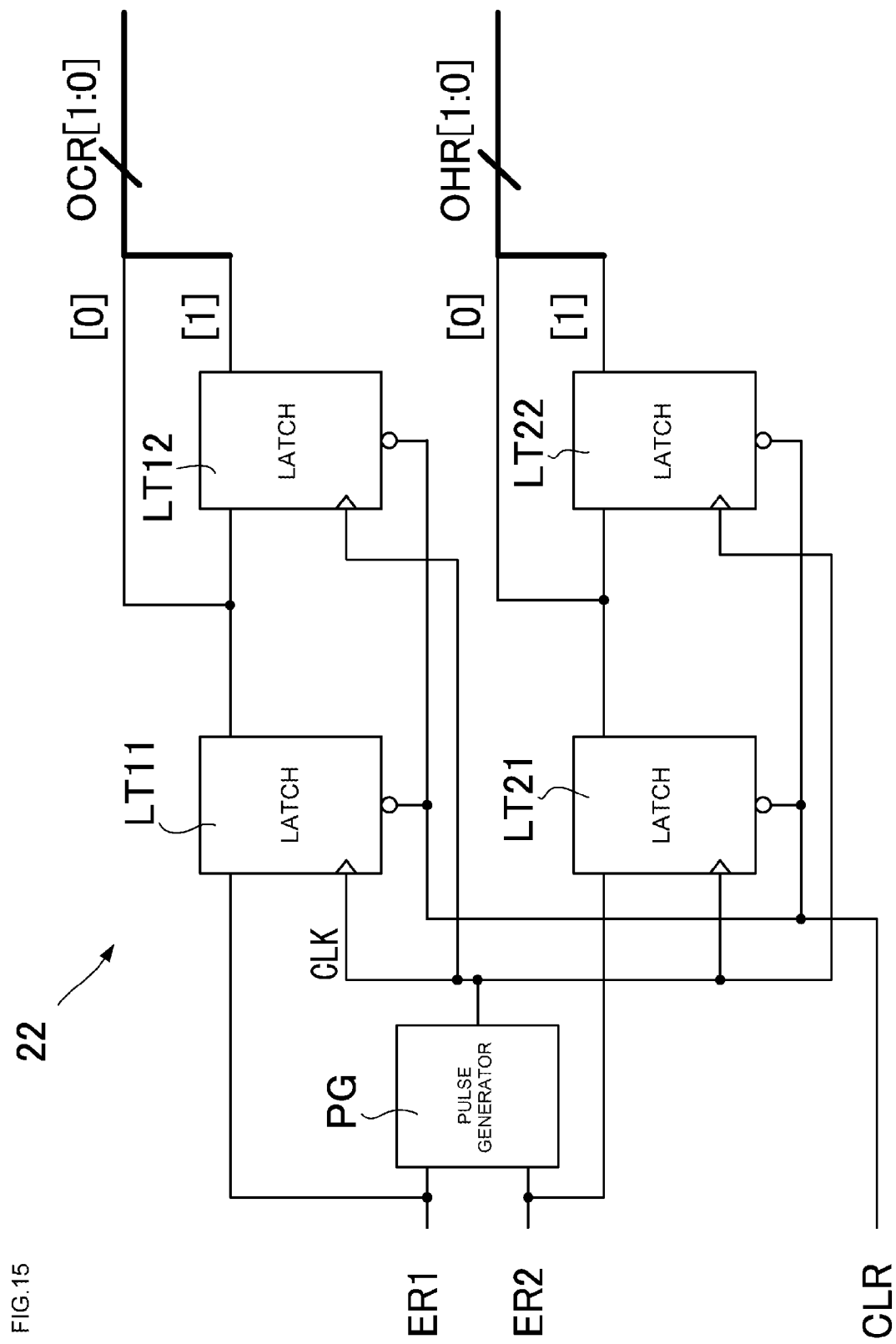
FIG. 15 is a diagram showing a configuration example of a latch circuit in the third embodiment of the invention.

Specifically, the latch circuit 22 includes in parallel two stage configuration latches LT11 and LT12 and latches LT21 and LT22, which respectively latch the abnormality detection signals ER1 and ER2 formed of the previously described pulse signals, as shown in, for example, FIG. 15. The latches LT11, LT12, LT21, and LT22 carry out a latching operation by receiving a clock signal CLK generated by a pulse generator circuit PG into which the abnormality detection signals ER1 and ER2 are input.

Herein, the pulse generator circuit PG is configured to, when one of the pulse signals forming the abnormality detection signals ER1 and ER2 is inverted, generate the clock signal CLK in synchronization therewith. Further, the first stage latches LT11 and LT21 receive the clock signal CLK and latch the abnormality detection signals ER1 and ER2 respectively. Also, the second stage latches LT12 and LT22 latch the abnormality detection signals held in the first stage latches LT11 and LT21 respectively.

Accordingly, signals indicating the status of a change in the abnormality detection signals ER1 and ER2 are latched by the previously described two stage configuration latches LT11 and LT12 and latches LT21 and LT22. Further, a total of two bits of signals latched and held in the latches LT11 and LT12 and latches LT21 and LT22 are output as the previously described abnormality detection signals OHR and OCR indicating overheat and overcurrent respectively. The latches LT11, LT12, LT21, and LT22 receive the clear signal CLR, to be described hereafter, and are reset and initialized in unison.

The signal analysis circuit 23 that analyzes the abnormality detection signals ER1 and ER2 held by the latch circuit 22 configured in this way determines the category of the abnormality indicated by the abnormality detection signals ER1 and ER2 from the change in the temporal transitional state of the abnormality detection signals ER1 and ER2 in accordance with the logic shown in, for example, FIG. 16. That is, when the abnormality detection signals OHR and OCR are "00" and "00", the signal analysis circuit 23 determines that there is no abnormality. Further, when the abnormality detection signal OHR is "11" and the abnormality detection signal OCR is "00", the signal analysis circuit 23 determines that this is an overheat abnormality.

Also, when the abnormality detection signal OHR is "00" and the abnormality detection signal OCR is "11", the signal analysis circuit 23 determines that this is an overcurrent abnormality. Further, when the abnormality detection signal OHR is "01" or "10" and the abnormality detection signal OCR is "10" or "01", the signal analysis circuit 23 determines that this is a low voltage abnormality. The determination of a low voltage abnormality, as previously described, is based on the fact that when the abnormality detection signal UVE is output, the two semiconductor switch elements 16 and 17 are alternately turned on and off in a cycle longer than that when the overheat and overcurrent are detected. That is, in this case, the determination is based on the fact that the signals held in the latch circuit 22 differ between the first stage and second stage, and that the abnormality detection signals ER1 and ER2 differ from each other.

Further, when the abnormality detection signals OHR and OCR are both of the same value at "10 (11)" and "11 (10)", the signal analysis circuit 23 determines that this state is a reception abnormality, as the pulse signals are generated under the condition that the semiconductor switch elements 16 and 17 are not caused to be turned on simultaneously, as previously described. In this case, the clear signal CLR is generated, thereby resetting the latch circuit 22. In this way, the signal analysis circuit 23 that analyzes the abnormality detection signal OHR and abnormality detection signal OCR is realized as a memory into which the abnormality detection signal OHR and abnormality detection signal OCR are input, and which selectively outputs the signals ERDET, OHER, OCER, UVER, and RXER indicating the category of the abnormality, which are results of the analysis.

Figure 17:
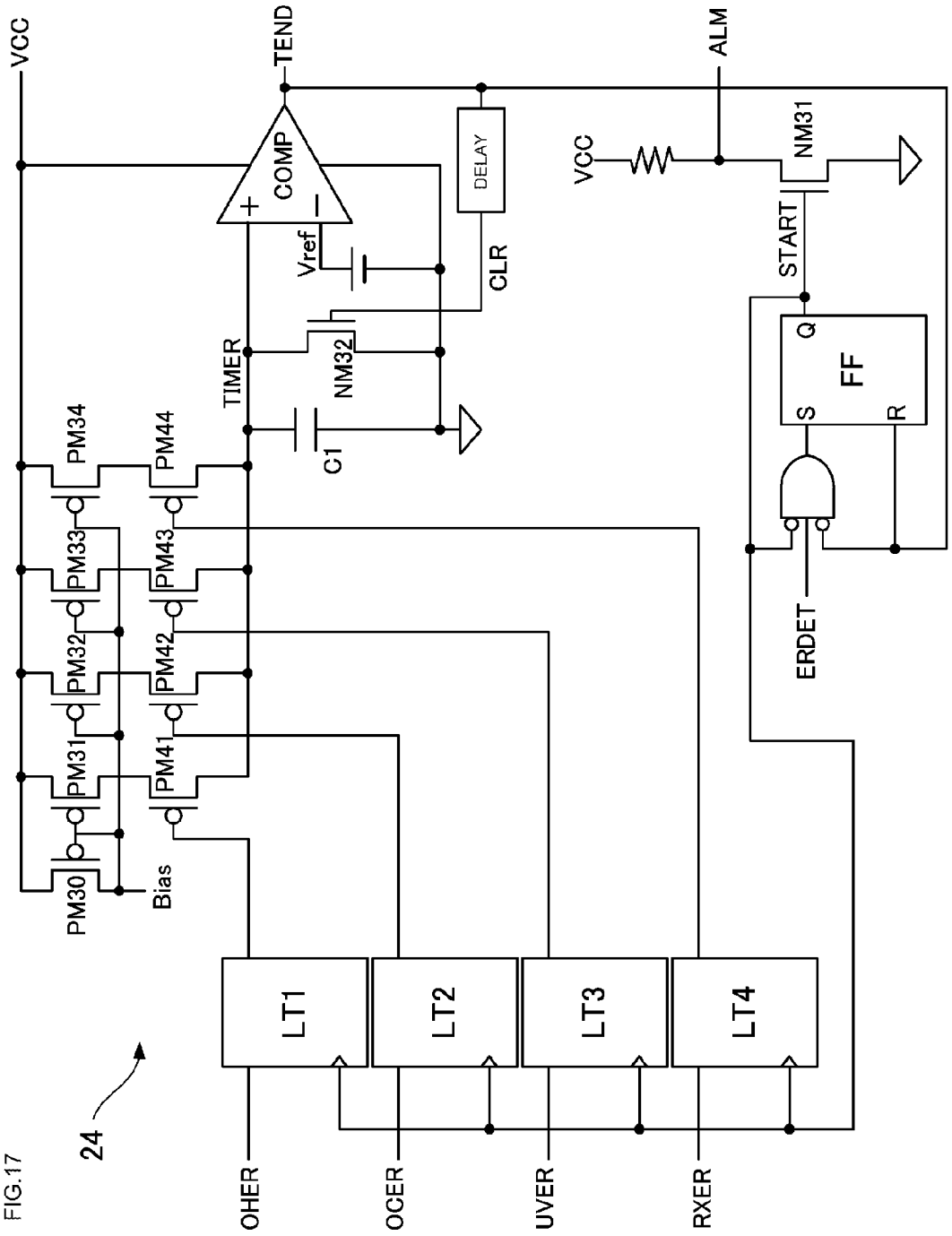
FIG. 17 is a diagram showing a configuration example of an alarm output circuit in the third embodiment of the invention.

The alarm output circuit 24 into which these kinds of analysis result, that is, the signals ERDET, OHER, OCER, UVER, and RXER, are input includes a flip-flop FF that is set by the abnormality detection signal ERDET being input, as shown in, for example, FIG. 17. Further, the alarm output circuit 24 is configured so that the alarm signal ALM is output by the n-channel MOSFET NM31 being driven to be turned on by a set output of the flip-flop FF.

Also, the alarm output circuit 24 includes in parallel four latches LT1, LT2, LT3, and LT4 that receive the set output of the flip-flop FF, and latch the signals OHER, OCER, UVER, and RXER respectively. Furthermore, the alarm output circuit 24 includes in parallel four p-channel MOSFETs PM31, PM32, PM33, and PM34 as a constant current supply forming a current mirror circuit with a p-channel MOSFET PM30. Further, four p-channel MOSFETs PM41, PM42, PM43, and PM44 acting as switches are connected in series with the p-channel MOSFETs PM31, PM32, PM33, and PM34 respectively.

The p-channel MOSFETs PM41, PM42, PM43, and PM44 are selectively turned on by the outputs of the latches LT1, LT2, LT3, and LT4, and perform a role of charging a capacitor C1 with the constant current supply formed of the p-channel MOSFETs PM31, PM32, PM33, and PM34. Further, a charge voltage generated in the capacitor C1 in accompaniment to the charging of the capacitor C1 is applied to a comparator COMP, and compared with a reference voltage Vref. Further, when the charge voltage of the capacitor C1 exceeds the reference voltage Vref, the comparator COMP issues an end signal TEND commanding a stopping of the alarm signal output.

The n-channel MOSFET NM32 connected in parallel with the capacitor C1 is driven to be turned on by the end signal TEND via a delay circuit, the charge of the capacitor C1 is released, and the capacitor C1 is reset. Also, the end signal TEND is applied to the reset terminal of the flip-flop FF, and input into an AND gate circuit provided at a stage before the set terminal of the flip-flop FF. The AND gate circuit performs a role of applying the abnormality detection signal ERDET to the set terminal of the flip-flop FF only when the flip-flop FF is in a reset state and the end signal TEND is not being output.

Figure 18:
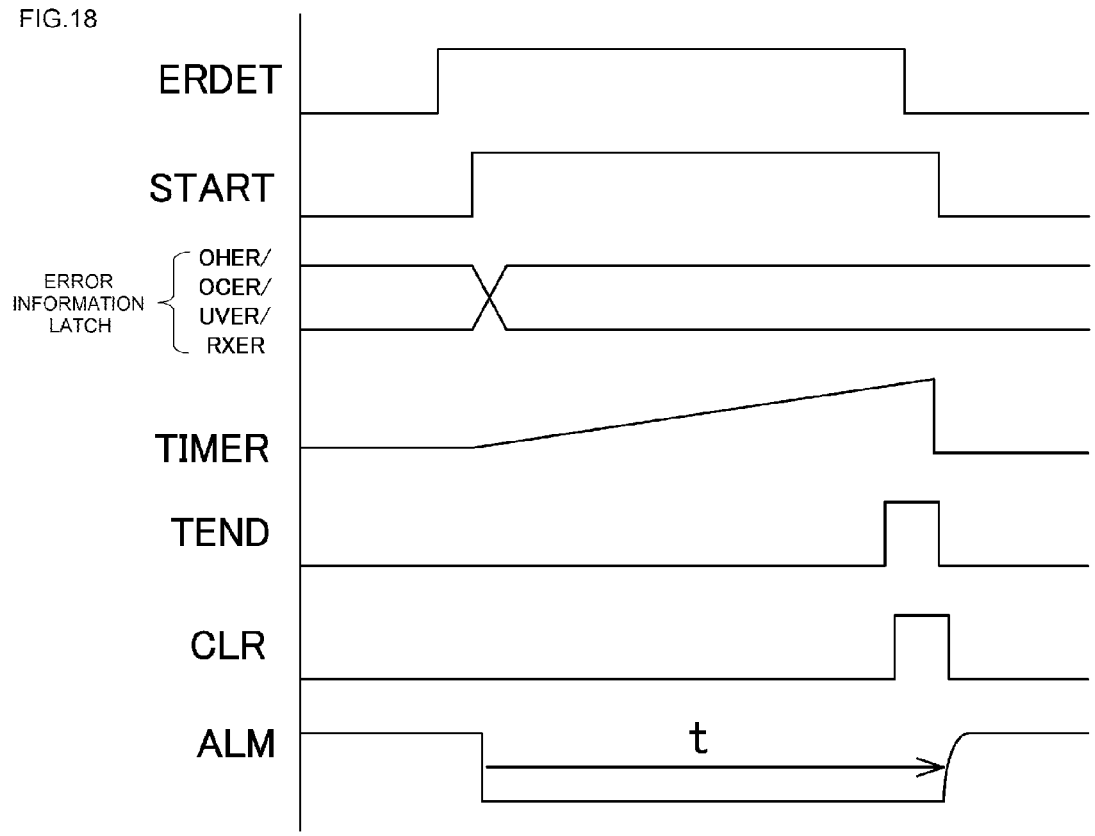
FIG. 18 is a timing diagram showing an operation of the alarm output circuit shown in FIG. 17.

Accordingly, the flip-flop FF is set at a timing at which the abnormality detection signal ERDET is input, and after charging of the capacitor C1 is started in accompaniment to the setting, the flip-flop FF is reset when the charge voltage of the capacitor C1 exceeds the reference voltage Vref and the end signal TEND is output, as shown in FIG. 18. As a result, the alarm signal ALM is output for a period t in which the flip-flop FF is set.

At this time, provided that the constant current value set in each of the p-channel MOSFETs PM31, PM32, PM33, and PM34 is weighted, the charge current of the capacitor C1 changes in accordance with the category of the signals OHER, OCER, UVER, and RXER. As a result of this, a time difference occurs in the period t until the charge voltage of the capacitor C1 reaches the reference voltage Vref, that is, in the timing at which the end signal TEND is generated. Accordingly, it is possible to change the output time of the alarm signal ALM in accordance with the category of the signals OHER, OCER, UVER, and RXER. Further, it is possible to determine the category of the abnormality detection by distinguishing the output time of the alarm signal ALM.

In this way, according to the signal transmission circuit 1 configured in this way, the signals OHER, OCER, and UVER indicating abnormality categories in a predetermined order of priority are generated in accordance with multiple kinds (three kinds in this example) of abnormality detection signal OHIN, OCIN, and UVIN generated in the high side circuit 10. Further, a pulse signal that causes one of the previously described two semiconductor switch elements 16 and 17 to be continuously turned on and off, or a pulse signal that causes the semiconductor switch elements 16 and 17 to be alternately turned on, is generated in accordance with the signals OHER, OCER, and UVER. Further, the pulse signals are transmitted to the low side circuit 20 via the semiconductor switch elements 16 and 17.

Accordingly, signal transmission to the low side circuit 20 can be carried out unaffected by power supply voltage fluctuation (dV/dt) in the high side circuit 10. Also, as the semiconductor switch elements 16 and 17 are not simultaneously driven to be turned on, the effect of in-phase noise commingled in the two semiconductor switch elements 16 and 17 is easily and effectively eliminated, and each of the pulse signals can be reliably detected.

Therefore, the category of an abnormality occurring in the high side circuit 10 can be accurately identified in the low side circuit 20 from pulse signals transmitted via each of the semiconductor switch elements 16 and 17. In particular, as the categories of three kinds of abnormality occurring in the high side circuit 10, including a state of no abnormality, can be easily and reliably transmitted to the low side circuit 20 using the two semiconductor switch elements 16 and 17, there are a large number of practical advantages.

The signal transmission circuit 1 can also be configured so that the three switch elements PM1, PM2, and PM3 are provided in parallel, and signal transmission from the high side circuit 10 to the low side circuit 20 is carried out by pulse signals causing the switch elements PM1, PM2, and PM3 to be alternatively turned on being generated. In this case, it is sufficient that, for example, a pulse signal causing only one of the switch elements PM1, PM2, and PM3 to be turned on and off in a first cycle, and a second cycle pulse signal causing two of the switch elements PM1, PM2, and PM3 to be alternately turned on and off, are generated in accordance with the category of an abnormality occurring in the high side circuit 10. By so doing, six kinds of abnormality category, including a state of no abnormality, can be transmitted.

Fourth Embodiment

Figure 19:
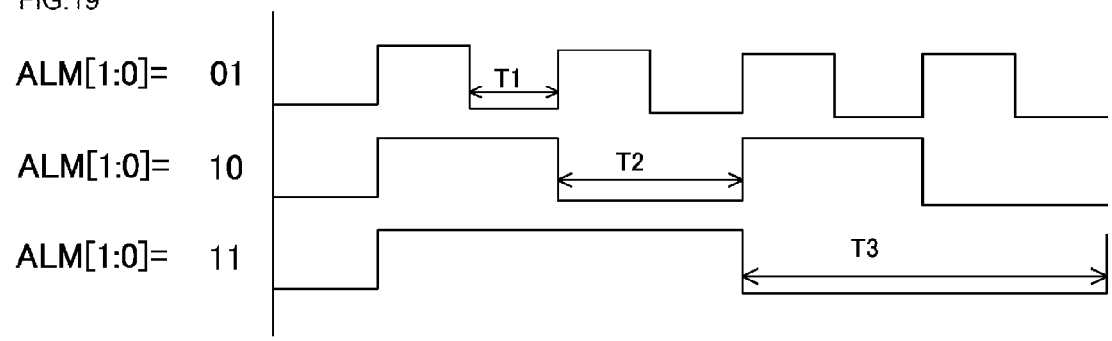
FIG. 19 is a diagram showing an outline of signal transmission according to a fourth embodiment of the invention.

In this embodiment, three kinds of pulse signal of differing pulse widths are generated, as shown in, for example, FIG. 19, in accordance with the abnormality detection signals OHE, OCE, and UVE obtained in accordance with the signal category order of priority by the previously described arbiter circuit 14. Further, the pulse signals are configured so as to be transmitted to the low side circuit 20 via only the one semiconductor switch element 16, as shown in, for example, FIG. 20. Herein, pulse widths T1, T2, and T3 of the three kinds of pulse signal are set as "T2=2·T1" and "T3=2·T2=4·T1", as shown in, for example, FIG. 19.

These kinds of pulse signal of the pulse widths T1, T2, and T3 in accordance with the abnormality signal category are generated using, for example, a 3-bit counter 18, which counts reference clock signals of a predetermined frequency, and a multiplexer 19, which selects the output of the counter 18. Specifically, the pulse signals are generated by, for example, controlling the operations of the counter 18 and multiplexer 19 in accordance with the abnormality detection signals OHE, OCE, and UVE indicating the abnormality signal categories formed of the two bits of data "01", "10", and "11". Further, the semiconductor switch element 16 is continuously driven to be turned on and off using the pulse signals of the pulse widths T1, T2, and T3.

Meanwhile, using a pulse signal obtained by voltage conversion via the voltage conversion unit 21a, a capacitor C2 is charged over the duration of the pulse signal in the low side circuit 20. Further, the charge voltage of the capacitor C2 is compared with each of reference voltages Vref1, Vref2, and Vref3 by three comparators CMP1, CMP2, and CMP3 provided in parallel, and outputs ALM1, ALM2, and ALM3 corresponding to each pulse width are obtained, in a pulse width detection circuit 25. Then, the pulse width detection circuit 25 carries out a masking process on the outputs ALM1, ALM2, and ALM3 of the comparators CMP1, CMP2, and CMP3 via AND gate circuits AND1 and AND2, and selectively outputs one of the outputs ALM1, ALM2, and ALM3.

Figure 20:
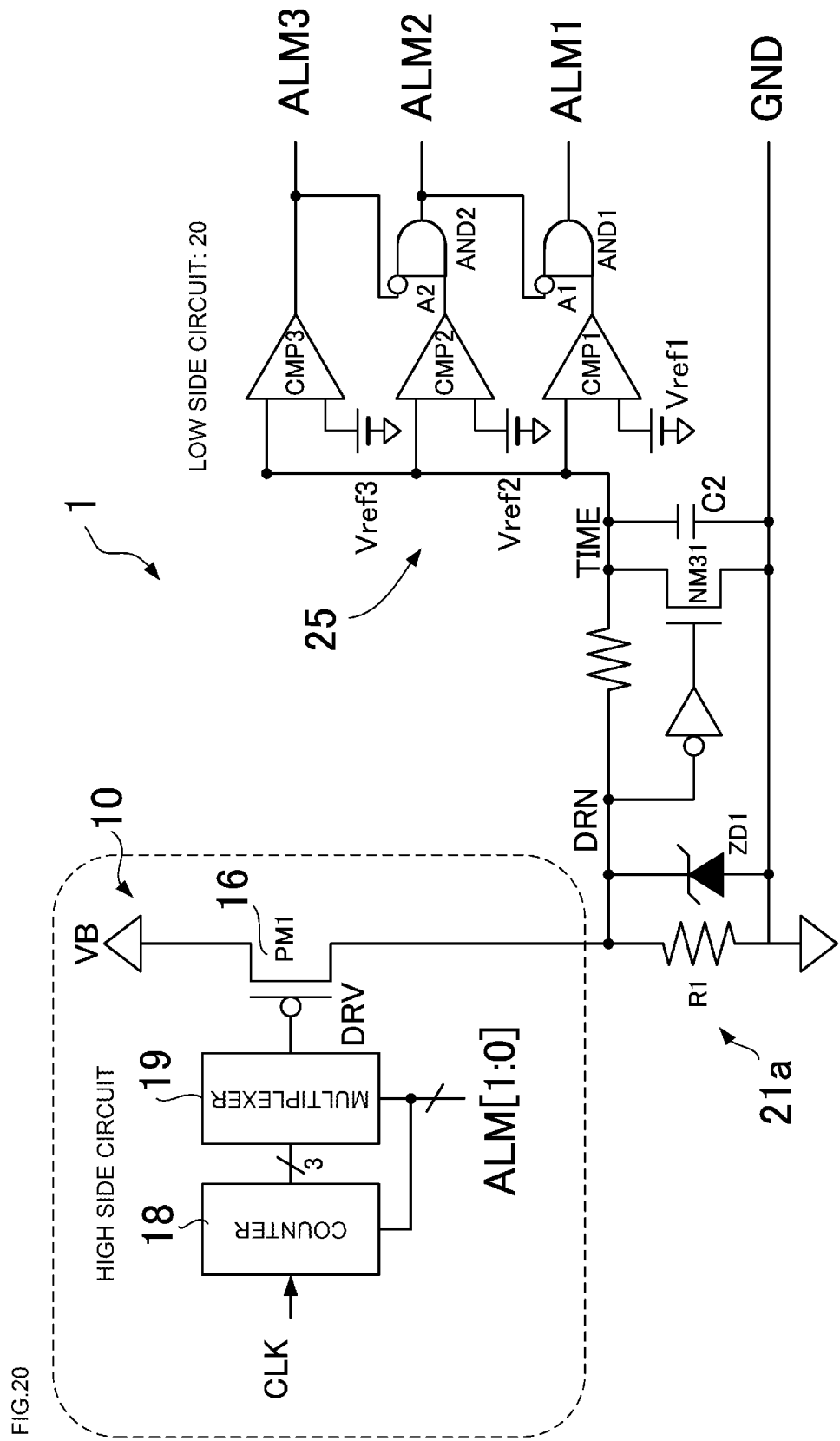
FIG. 20 is a main portion schematic configuration diagram of a signal transmission circuit according to the fourth embodiment of the invention.

Herein, the configuration in this example is such that the alarm signals are output in an order of priority wherein "ALM1<ALM2<ALM3". Also, the n-channel MOSFET NM31 connected in parallel with the capacitor C2 in FIG. 20 is driven to be turned on by the pulse signal inverted via a NOT circuit, and performs a role of releasing the charge of the capacitor C2.

Figure 21:
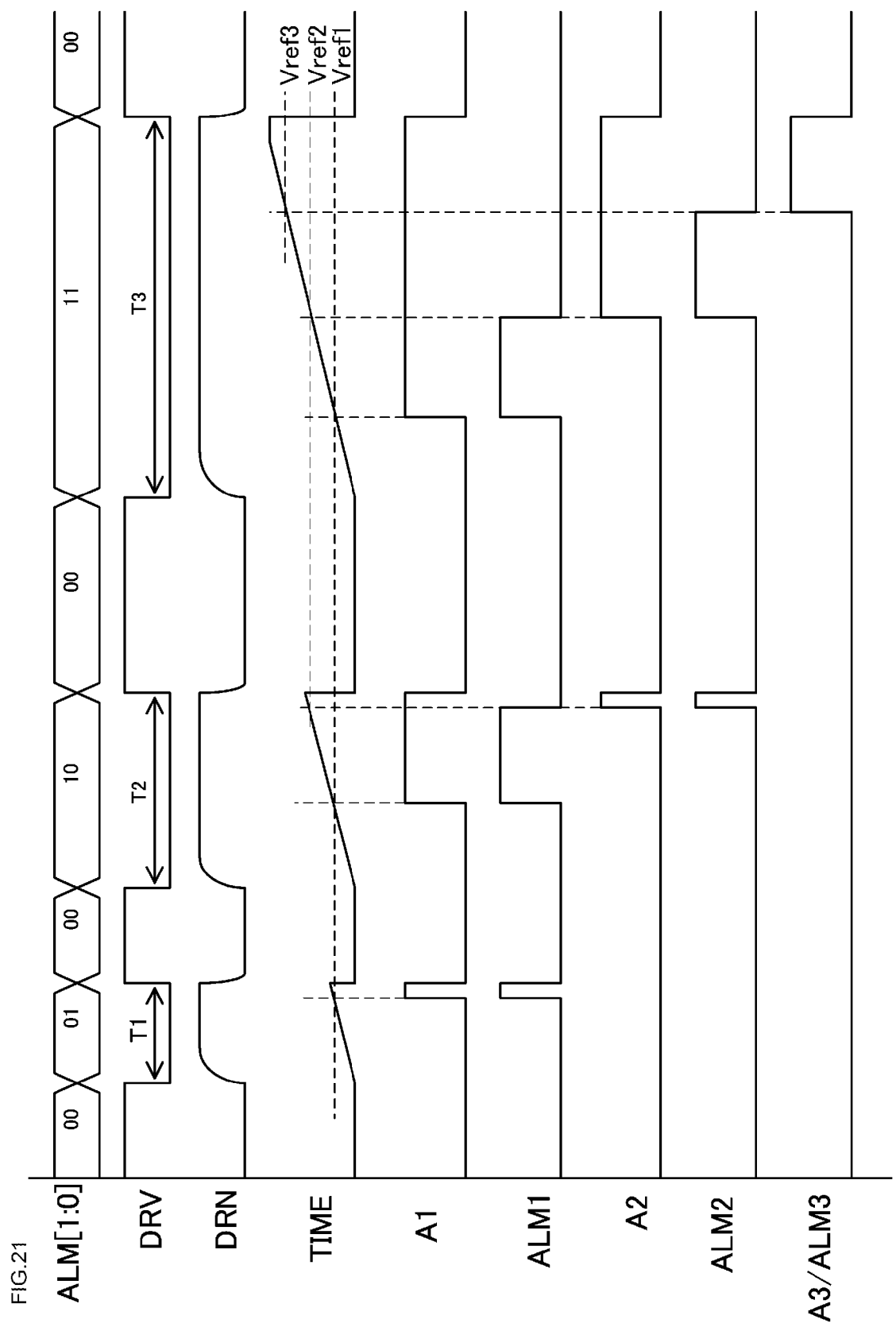
FIG. 21 is a timing diagram showing an aspect of signal transmission by the signal transmission circuit shown in FIG. 20.

In this way, according to the signal transmission circuit 1 configured in this way, the pulse widths T1, T2, and T3 of the pulse signal driving the switch element PM1 to be turned on are changed in accordance with the abnormality detection signal category, as shown by the operation timings in FIG. 21, because of which the charge voltage of the capacitor C2 changes in response. Further, when the charge voltage of the capacitor C2 exceeds the reference voltages Vref1, Vref2, and Vref3, the comparators CMP1, CMP2, and CMP3 sequentially invert outputs A1, A2, and A3 thereof.

Further, the outputs A1, A2, and A3 of the comparators CMP1, CMP2, and CMP3 are sequentially masked by the outputs A2 and A3 of the upper level comparators CMP2 and CMP3, of which the reference voltage is set high. As a result of this, provided that the outputs A1, A2, and A3 of the comparators CMP1, CMP2, and CMP3 are extracted at the timing at which the capacitor C2 is reset, the abnormality detection outputs ALM1, ALM2, and ALM3 in accordance with the abnormality category can thereby be alternatively obtained.

Accordingly, when transmitting pulse signals of the pulse widths T1, T2, and T3 in accordance with the abnormality category via the semiconductor switch element 16 too, as heretofore described, the category of an abnormality occurring in the high side circuit 10 can be easily, and moreover reliably, transmitted to the low side circuit 20, in the same way as in the previous embodiment. Moreover, signal transmission indicating the abnormality category can be reliably carried out simply by using the one semiconductor switch element 16. In the case of this embodiment, however, it cannot be denied that, depending on the setting conditions of the pulse signal pulse widths T1, T2, and T3, time is needed from the signal transmission to the analysis of the pulse signal. Accordingly, it goes without saying that it is desirable that the pulse widths T1, T2, and T3 are appropriately set in accordance with an urgency stipulated in accordance with the abnormality category.

Fifth Embodiment

Figure 22:
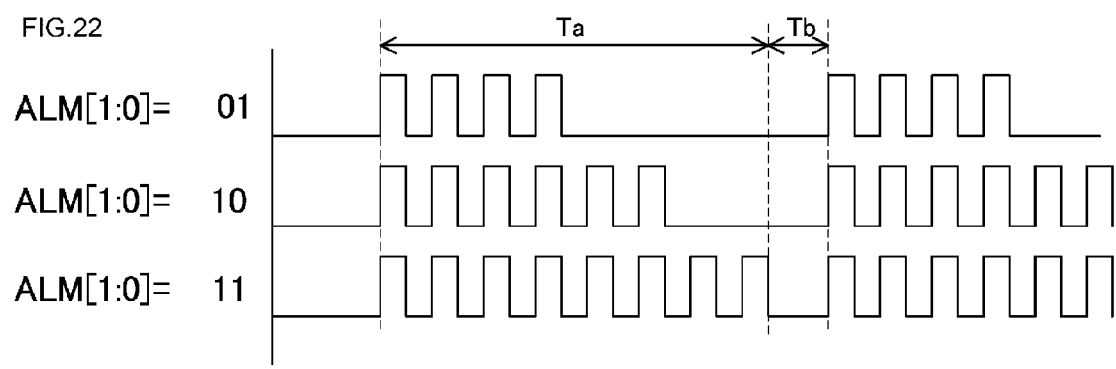
FIG. 22 is a diagram showing an outline of signal transmission according to a fifth embodiment of the invention.
Figure 23:
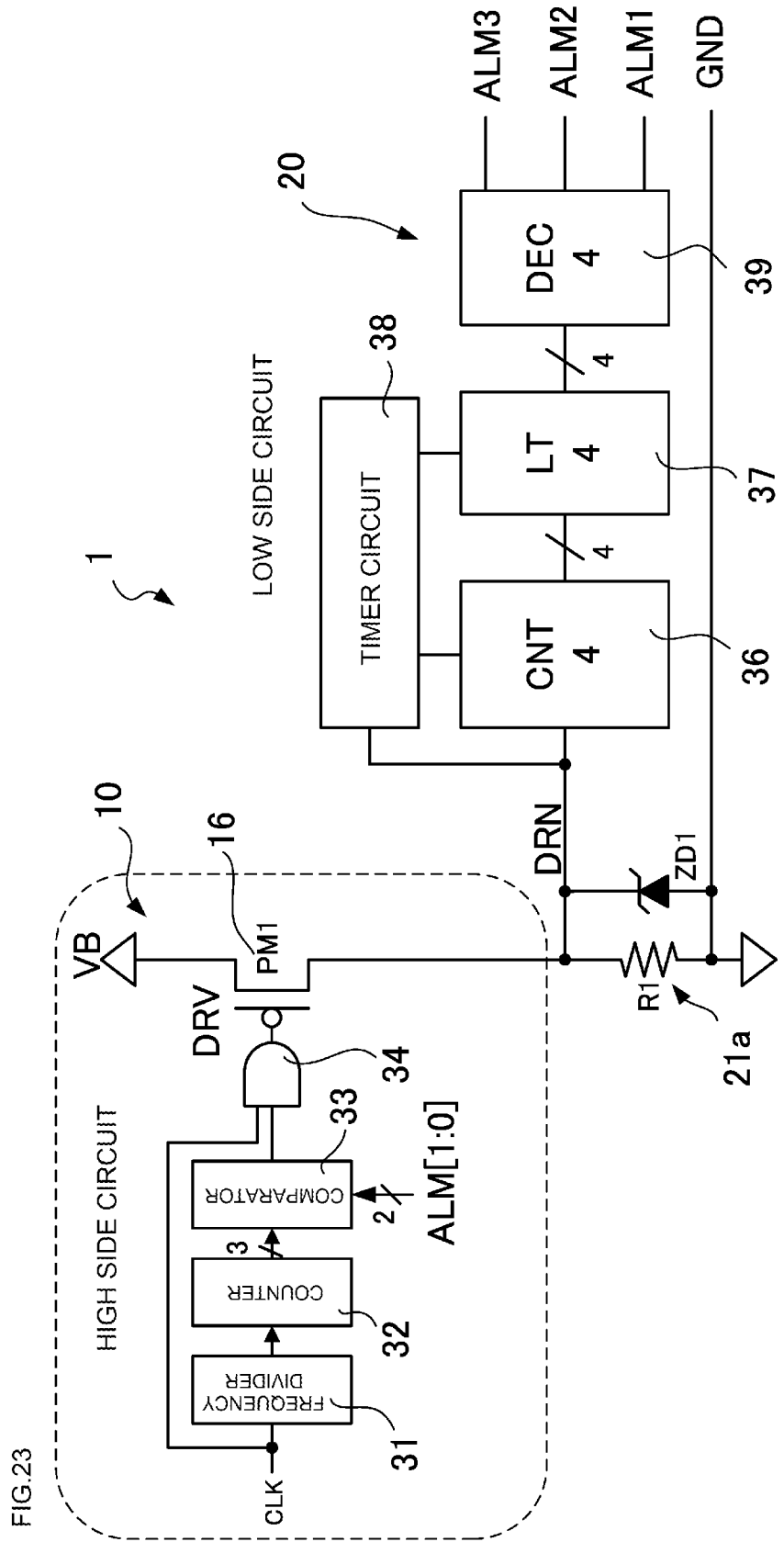
FIG. 23 is a main portion schematic configuration diagram of a signal transmission circuit according to the fifth embodiment of the invention.

In another embodiment of the invention, three kinds of pulse signal train of differing pulse numbers n are generated, as shown in, for example, FIG. 22, in accordance with the abnormality detection signals OHE, OCE, and UVE obtained in accordance with the signal category order of priority by the previously described arbiter circuit 14. Further, the pulse signal trains are transmitted to the low side circuit 20 via only the one semiconductor switch element 16, as shown in, for example, FIG. 23. Herein, the three kinds of pulse signal train of differing pulse numbers are such that the pulse number n output in a constant signal output period Ta set sandwiching a constant idle period Tb is caused to differ, as shown in, for example, FIG. 22.

In the example shown in FIG. 22, the pulse number n in the signal output period Ta is set as four pulses, six pulses, and eight pulses in accordance with the abnormality detection signals OHE, OCE, and UVE. After the frequency of the reference clock signal CLK is divided by a frequency divider 31 as shown in, for example, FIG. 23, this kind of pulse signal train is counted by a 3-bit counter 32. Then, the value of the counting by the counter 32 and 2-bit alarm information indicating the abnormality detection signals OHE, OCE, and UVE are compared by a comparator 33, an AND gate circuit 34 is controlled in accordance with the result of the comparison, and the reference clock signal CLK is generated by masking.

As a result of this, the number of pulses of the reference clock signal CLK provided to the semiconductor switch element 16 via the AND gate circuit 34 is limited in accordance with the category of the abnormality detection signals OHE, OCE, and UVE. Further, the semiconductor switch element 16 is driven to be turned on and off a number of times equivalent to the number of pulses of the reference clock signal CLK passing through the AND gate circuit 34 in one operating cycle (Ta+Tb) of the counter 32.

Also, it is sufficient that the category of the abnormality detection signal is analyzed from the pulse number of the pulse signal in the following way in the low side circuit 20 that receives a pulse signal transmitted from the high side circuit 10 in this way. That is, a pulse signal obtained by voltage conversion via the voltage conversion unit 21a is counted by a 4-bit counter 36, and the value of the counting is latched by a latch circuit 37. At this time, the counting operation of the counter 36 and the timing of the latching by the latch circuit 37 are controlled by a timer circuit 38.

Figure 24:
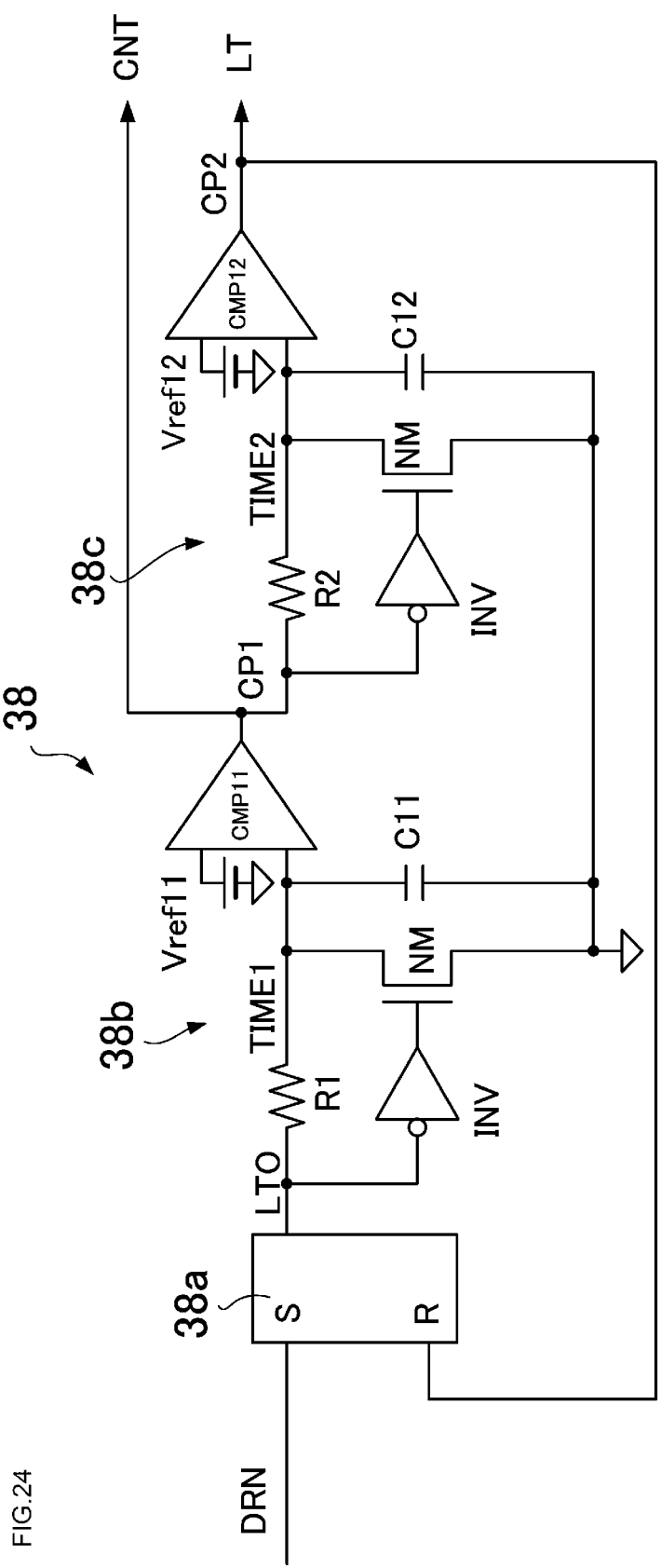
FIG. 24 is a diagram showing a configuration example of a timer circuit in the fifth embodiment of the invention.

Herein, the timer circuit 38 includes a flip-flop (FF) 38a that is set by receiving a pulse signal obtained from the voltage conversion unit 21a, as shown in, for example, FIG. 24. Also, the timer circuit 38 includes a first timer 38b that compares the charge voltage of a capacitor C11, charged by receiving the set output of the flip-flop 38a, with a predetermined reference voltage Vref11 in a first comparator CMP11. Further, the timer circuit 38 is configured so that the output period Ta of the pulse signal is obtained by the first timer 38b.

Furthermore, the timer circuit 38 includes a second timer 38c that compares the charge voltage of a capacitor C12, charged by the output of the first comparator CMP11, with a predetermined reference voltage Vref12 in a second comparator CMP12. Further, the timer circuit 38 is configured so that the idle period Tb of the pulse signal is obtained by the second timer 38c. Based on this, the timer circuit 38 is configured so that the first and second timers 38b and 38c are initialized by the flip-flop 38a being reset by the output of the second comparator CMP12, which is the second timer 38c.

According to the timer circuit 38 configured in this way, the flip-flop 38a is set at the point at which a pulse signal transmitted from the high side circuit 10 via the voltage conversion unit 21a is received. Accordingly, the first timer 38b starts a timer operation with the timing at which the pulse signal is received as the starting point, and causes a counting operation by the counter 36 to stop at the point at which the period Ta elapses. Accordingly, the counter 36 counts only the pulse signals received during the period Ta. In other words, the pulse number of the pulse signal transmitted from the high side circuit 10 in accordance with the category of the abnormality detection signals OHE, OCE, and UVE is obtained by the counter 36.

Subsequently, the latch circuit 37 is started up by the second timer 38c at the point at which the idle period Tb elapses, and the pulse signal pulse number obtained by the counter 36 is latched. Then, the pulse number that is the count value held by the latch circuit 37 is provided to a decoder 39, and an alarm output in accordance with the pulse number is obtained. Herein, the decoder 39 is configured so as to change the outputs ALM1, ALM2, and ALMS thereof in accordance with the count value held by the latch circuit 37, as shown in, for example, FIG. 25.

Figure 26:
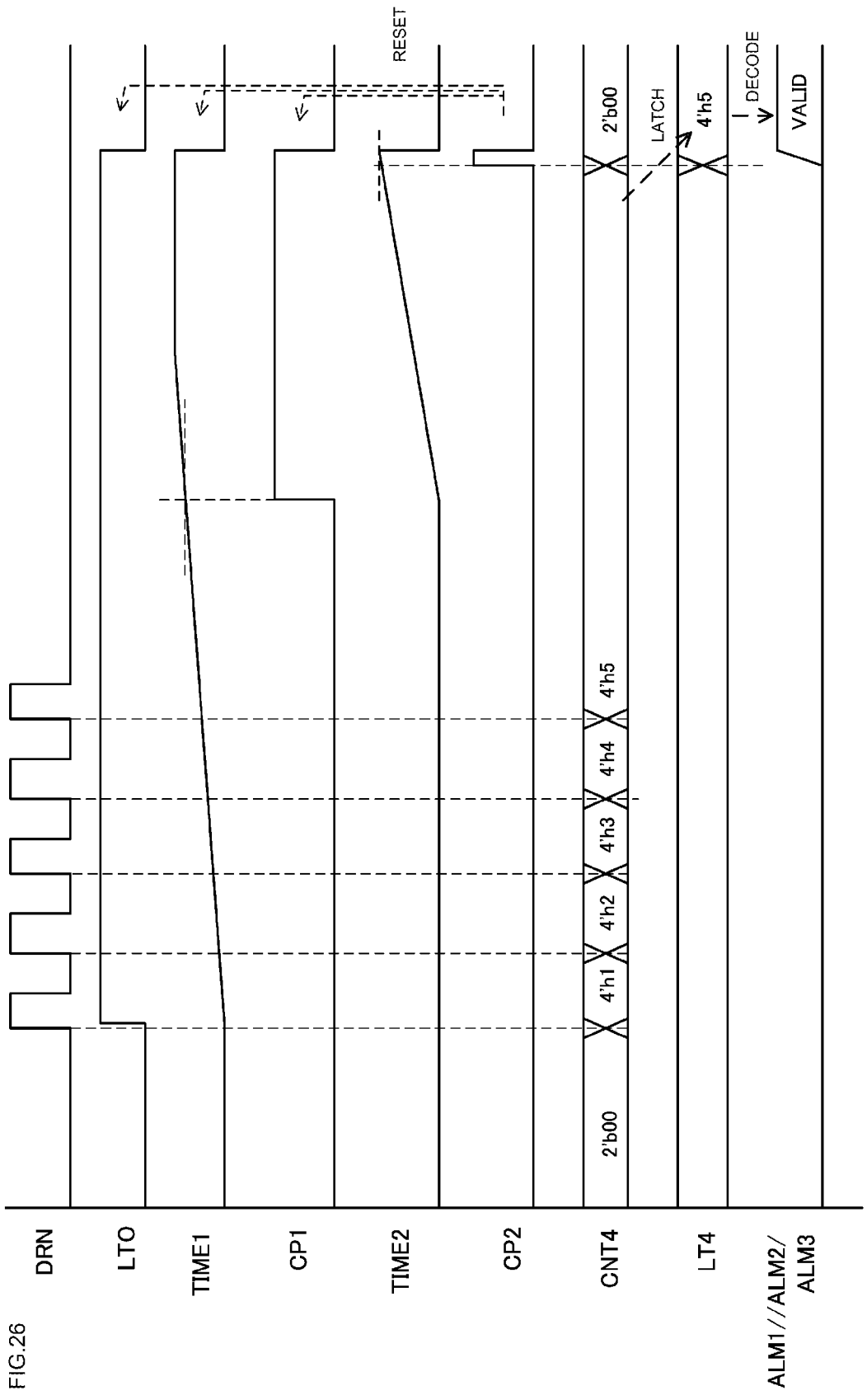
FIG. 26 is a timing diagram showing an aspect of signal transmission by the signal transmission circuit shown in FIG. 25.
Figure 27:
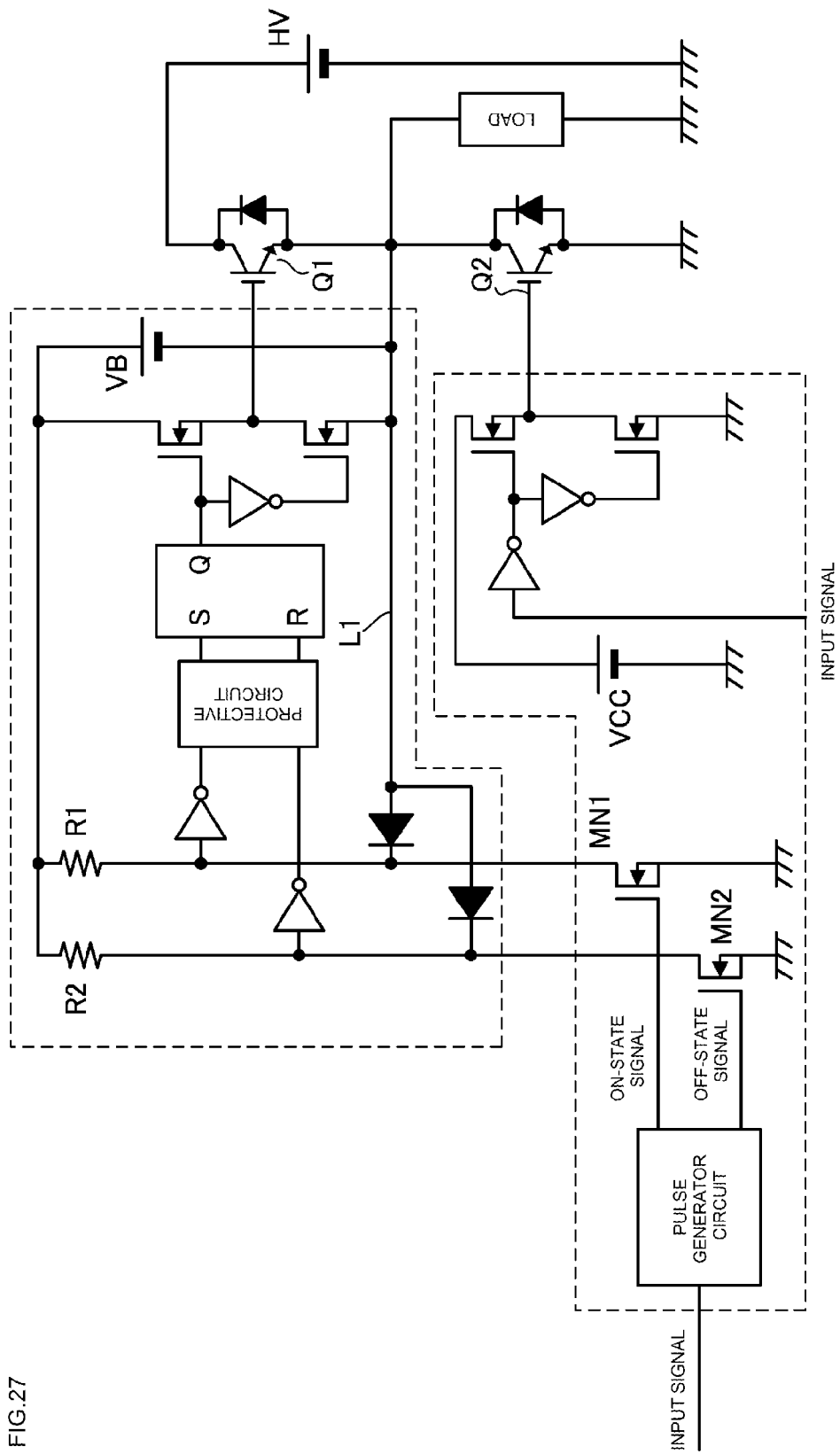
FIG. 27 is a diagram showing a configuration example of an existing power converter including a level shifter circuit.
Figure 28:
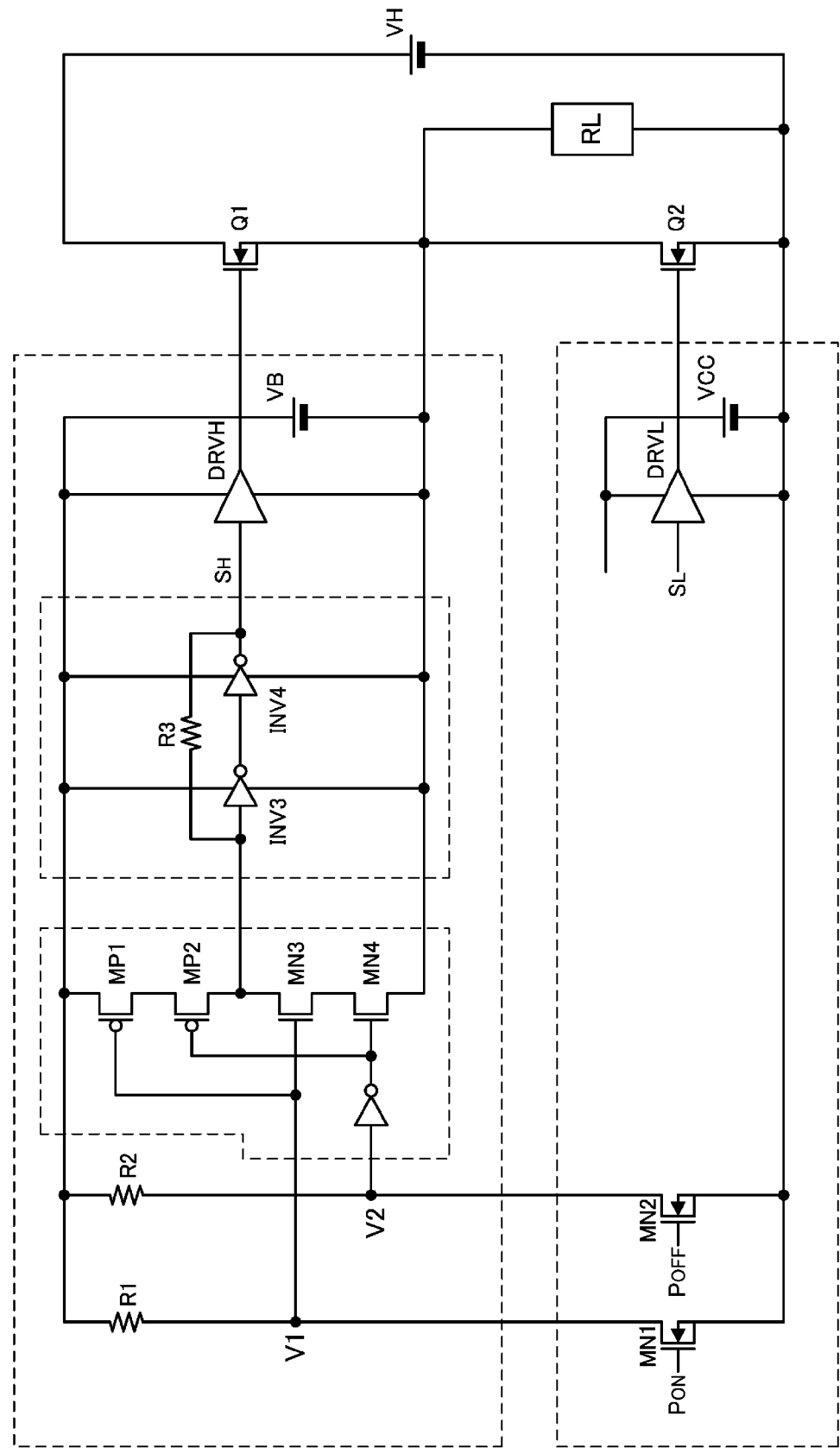
FIG. 28 is a diagram showing another configuration example of an existing power converter including a level shifter circuit.

Accordingly, according to the signal transmission circuit 1 configured as heretofore described, the output pulse number in the constant period Ta of a pulse signal that drives the semiconductor switch element 16 so as to be turned on is changed in accordance with the abnormality detection signal category, as shown by the operation timing thereof in FIG. 26. Therefore, by the pulse signal pulse number detected in the constant period Ta being counted by the counter 36, and the count value being analyzed, the category of an abnormality occurring in the high side circuit 10 can be determined in the low side circuit 20, in the same way as in the previous embodiments.

In particular, according to the signal transmission circuit 1 according to this embodiment, it is sufficient to change the pulse number n in the constant period Ta of a pulse signal transmitted via the semiconductor switch element 16 in accordance with the abnormality detection signal category, because of which the abnormality detection signal category can be easily, and moreover reliably, transmitted to the low side circuit 20. Moreover, signal transmission indicating the abnormality category can be reliably carried out simply by using the one semiconductor switch element 16, in the same way as in the previous embodiment. Therefore, the same advantages as in each of the previous embodiments are achieved.

The invention is not limited by the heretofore described embodiments. For example, it is sufficient that the number of times the 2-bit information formed of "01" or "10" is transmitted is determined in accordance with the number of kinds of signal to be transmitted. Also, as it is sufficient that the voltage detection circuit is such that it is possible to detect voltage generated in the second circuit in accompaniment to the first and second semiconductor switch elements being alternatively turned on and off, the voltage detection circuit is not particularly limited to the circuit shown as an example in the previously described embodiments.

Also, signal transmission can also be carried out by using a combination of, for example, the signal transmission control in the third embodiment and the signal transmission control according to the fourth or fifth embodiment. Specifically, the cycle of a continuous pulse signal that continuously causes one of the two semiconductor switch elements 16 and 17 to be turned on and off may be changed in accordance with the abnormality detection signal category, or the cycle of a pulse signal that causes the two semiconductor switch elements 16 and 17 to be alternately turned on and off may be changed in accordance with the abnormality detection signal category. By so doing, still more categories of signal can be transmitted from the high side circuit 10 to the low side circuit 20.

Furthermore, it is sufficient that the pulse signal cycle, and the like, in each of the previously described embodiments is set in accordance with specifications such as the frequency with which a signal to be transmitted from the high side circuit 10 to the low side circuit 20 occurs and the urgency of the signal transmission. Various other modifications are possible without departing from the scope of the invention.

REFERENCE SIGNS AND NUMERALS

UD1, LD1 High breakdown voltage switching element
HVIC High voltage integrated circuit
HD High side driver
LD Low side driver
CONT Control device
1 Signal transmission circuit
10 High side circuit
11 Overheat detection unit
12 Overcurrent detection unit
13 Voltage drop detection unit
14 Arbiter circuit
15 Pulse generator circuit
16 Semiconductor switch element (PM1)
17 Semiconductor switch element (PM2)
20 Low side circuit
21 Voltage conversion circuit
21a Voltage conversion unit
21b In-phase noise filter
22 Latch circuit
23 Signal analysis circuit
24 Alarm output circuit
28 Semiconductor switch element (NM1)
29 Semiconductor switch element (NM2)

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A signal transmission circuit that shifts a level of and transmits a multiple of signals between first and second circuits operating with mutually differing voltages as reference potentials, comprising:
   the first circuit in a signal transmission side having
      first and second semiconductor switch elements that transmit a voltage, including one of a reference potential and power supply voltage, of the first circuit to the second circuit in a signal reception side by being alternatively driven to be turned on and off in accordance with the multiple of signals; and
   the second circuit in the signal reception side having
      a voltage conversion circuit, including an in-phase noise filter that eliminates in-phase noise superimposed on the voltage transmitted from the first circuit via the first and second semiconductor switch elements, that generates first and second pulse signals in accordance with the voltage transmitted via the first and second semiconductor switch elements,
      a latch circuit that latches each of the first and second pulse signals with the first and second pulse signals generated by the voltage conversion circuit as a clock, and
      a signal analysis circuit that determines a category of the multiple of signals by analyzing the first and second pulse signals latched by the latch circuit, and generates an output signal in accordance with the determined signal category.

2. The signal transmission circuit according to claim 1, wherein the alternative driving of the first and second semiconductor switch elements to be turned on and off is executed over a multiple of stages in accordance with the signal category.

3. The signal transmission circuit according to claim 1, wherein the latch circuit is a shift register formed of multiple stages of D-type flip-flops connected in cascade.

4. The signal transmission circuit according to claim 1, wherein the in-phase noise filter is formed of a logic circuit that prohibits the generation of the first and second pulse signals by the voltage conversion circuit when the voltages transmitted via the first and second semiconductor switch elements change simultaneously.

5. The signal transmission circuit according to claim 1, wherein the first and second semiconductor switch elements are high breakdown voltage semiconductor elements that are alternatively driven to be turned on and off by receiving pulse signals generated in accordance with an order of priority of a multiple of signals.

6. The signal transmission circuit according to claim 1, wherein the first and second circuits drive first and second power semiconductor elements that are connected in series to form a half-bridge circuit and supply power to a load from a midpoint of the half-bridge circuit by being alternately driven to be turned on and off.

7. The signal transmission circuit according to claim 6, wherein the first and second power semiconductor elements are high breakdown voltage MOSFETs or IGBTs that supply power to a load.

8. The signal transmission circuit according to claim 6, wherein
   the first circuit is a high side circuit that operates with the midpoint voltage of the half-bridge circuit as the reference potential, and
   the second circuit is a low side circuit that operates with a ground voltage as the reference potential.

9. The signal transmission circuit according to claim 8, wherein the multiple of signals transmitted from the high side circuit to the low side circuit are signals indicating a category of an operating abnormality of the first power semiconductor element driven to be switched by the high side circuit.

10. The signal transmission circuit according to claim 6, wherein
   the first circuit is a low side circuit that operates with a ground voltage as the reference potential, and
   the second circuit is a high side circuit that operates with a midpoint voltage of the half-bridge circuit as the reference potential.

11. The signal transmission circuit according to claim 10, wherein the multiple of signals transmitted from the low side circuit to the high side circuit are signals controlling the drive of the first power semiconductor element in the high side circuit.

* * * * *